United States Patent
Honda et al.

(10) Patent No.: US 9,340,865 B2
(45) Date of Patent: May 17, 2016

(54) THIN FILM-MANUFACTURING APPARATUS, THIN FILM-MANUFACTURING METHOD, AND SUBSTRATE-CONVEYING ROLLER

(75) Inventors: Kazuyoshi Honda, Osaka (JP); Satoshi Shibutani, Osaka (JP); Yasuharu Shinokawa, Osaka (JP); Sadayuki Okazaki, Osaka (JP); Noriyuki Uchida, Osaka (JP); Noriaki Amo, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 778 days.

(21) Appl. No.: 13/575,244

(22) PCT Filed: Jan. 26, 2011

(86) PCT No.: PCT/JP2011/000426
§ 371 (c)(1),
(2), (4) Date: Jul. 25, 2012

(87) PCT Pub. No.: WO2011/093073
PCT Pub. Date: Aug. 4, 2011

(65) Prior Publication Data
US 2012/0301615 A1 Nov. 29, 2012

(30) Foreign Application Priority Data

Jan. 26, 2010 (JP) .................................. 2010-013803
Aug. 30, 2010 (JP) .................................. 2010-191799
Aug. 30, 2010 (JP) .................................. 2010-191800

(51) Int. Cl.
*C23C 16/00* (2006.01)
*C23C 14/30* (2006.01)
(Continued)

(52) U.S. Cl.
CPC ............... *C23C 14/30* (2013.01); *C23C 14/541* (2013.01); *C23C 14/562* (2013.01)

(58) Field of Classification Search
CPC ...... C23C 14/56; C23C 14/562; C23C 14/541
See application file for complete search history.

(56) References Cited

U.S. PATENT DOCUMENTS 3,414,048 A * 12/1968 Rall ................................ 165/89
4,688,335 A * 8/1987 Krill ........................ F26B 23/02
162/206

(Continued)

FOREIGN PATENT DOCUMENTS

DE 102004050821 A1 4/2006
JP 59131024 A * 7/1984

(Continued)

OTHER PUBLICATIONS

International Search Report issued in International Patent Application No. PCT/JP2011/000426 dated Mar. 15, 2011.

(Continued)

*Primary Examiner* — Gordon R Baldwin
*Assistant Examiner* — Charlee Bennett
(74) *Attorney, Agent, or Firm* — McDermott Will & Emery LLP

(57) ABSTRACT

A conveyance system 50A of a film-forming apparatus 20A includes a blowing roller 6 having a function of supplying a cooling gas toward a substrate 21. The blowing roller has the first shell 11 and the internal block 12. The first shell 11 has a plurality of first through holes 13 as a gas supply channel, and is rotatable in synchronization with the substrate 21. The internal block 12 is disposed inside the first shell 11. A manifold 14 is defined by the internal block 12 inside the first shell 11. The manifold 14 is formed so as to introduce the gas toward the plurality of first through holes 13 within the range of a holding angle. A clearance 15 facing the plurality of first through holes 13 outside the range of the holding angle is further formed inside the first shell 11. In the radial direction, the manifold 14 has a relatively large dimension, and the clearance 15 has a relatively small dimension.

28 Claims, 14 Drawing Sheets

(51) Int. Cl.
*C23C 14/54* (2006.01)
*C23C 14/56* (2006.01)

(56) References Cited

U.S. PATENT DOCUMENTS

| | | | |
|---|---|---|---|
| 5,076,203 A | | 12/1991 | Vaidya et al. |
| 6,054,018 A | * | 4/2000 | Denes et al. ............... 156/345.1 |
| 7,025,833 B2 | * | 4/2006 | Madocks ....................... 118/733 |
| 7,690,131 B2 | * | 4/2010 | Mausser ................. D21F 5/021 162/358.1 |
| 8,225,527 B2 | * | 7/2012 | Sferlazzo et al. ............... 34/413 |
| 8,697,582 B2 | * | 4/2014 | Okazaki et al. ............... 438/758 |
| 2004/0074443 A1 | | 4/2004 | Madocks |
| 2010/0272887 A1 | | 10/2010 | Honda et al. |
| 2010/0291308 A1 | * | 11/2010 | Sferlazzo .............. C23C 14/562 427/398.1 |

FOREIGN PATENT DOCUMENTS

| | | | |
|---|---|---|---|
| JP | 60-184424 | | 12/1985 |
| JP | 01-152262 | A | 6/1989 |
| JP | 06-145982 | A | 5/1994 |
| JP | 2010242200 | A * | 10/2010 |
| JP | 2011058079 | A * | 3/2011 |
| WO | WO-02/070778 | A1 | 9/2002 |
| WO | WO-2005/001157 | A2 | 1/2005 |
| WO | WO-2009/060597 | A1 | 5/2009 |

OTHER PUBLICATIONS

European Extended Search Report in European Patent Application No. 11736788.8, dated Oct. 20, 2015.

* cited by examiner

THIN FILM-MANUFACTURING APPARATUS, THIN FILM-MANUFACTURING METHOD, AND SUBSTRATE-CONVEYING ROLLER

RELATED APPLICATIONS

This application is the U.S. National Phase under 35 U.S.C. §371 of International Application No. PCT/JP2011/000426, filed on Jan. 26, 2011, which in turn claims the benefit of Japanese Application No. 2010-013803 filed on Jan. 26, 2010, Japanese Application No. 2010-191799 filed on Aug. 30, 2010, and Japanese Application No. 2010-191800 (disclosures of which Applications are incorporated by reference herein.

TECHNICAL FIELD

The present invention relates to a thin film-manufacturing apparatus, a thin film-manufacturing method, and a substrate-conveying roller.

BACKGROUND ART

Thin film techniques are widely developed for miniaturization and performance enhancement of devices. Devices in the form of a thin film not only provides a direct advantage for users but also plays an important role from an environmental viewpoint, for example, in conserving the earth resources or reducing power consumption.

For such development in thin film techniques, it is indispensable to satisfy requirements in view of industrial availability such as efficiency enhancement, stabilization, productivity enhancement, and cost reduction in the thin film-manufacturing method, for the purpose of which efforts have been continuously made.

In order to enhance the productivity of thin films, film-forming techniques at high deposition rates are essential. In thin film-manufacturing methods such as vacuum evaporation, sputtering, ion plating, CVD (Chemical Vapor Deposition), the deposition rate is progressively enhanced. Further, a thin film-manufacturing method of the take-up type is used as a method for continuously forming thin films in large scale. The thin film-manufacturing method of the take-up type is a method in which an elongated substrate wound into a roll is unwound from an unwinding roller to form a thin film on the substrate during the conveyance along a conveyance system, and thereafter the substrate is wound by a winding roller. For example, thin films can be formed with good productivity by combining a film-forming source that allows high deposition rate such as vacuum evaporation using an electron beam with the thin film-manufacturing method of the take-up type.

There are problems of thermal load during film formation and cooling of the substrate as factors that determine the success or failure of the continuous thin film production of the take-up type. For example, in the case of vacuum evaporation, thermal radiation from an evaporation source and thermal energy of evaporated atoms are applied onto a substrate, thereby increasing the temperature of the substrate. Also in other film-forming methods, a thermal load is applied, though the heat source is different, onto a substrate during film formation. The substrate is cooled in order to prevent such thermal load from causing the deformation, melting down, etc., of the substrate. The cooling is not necessarily carried out during film formation, and may be carried out on a substrate-conveyance channel other than the film-forming region.

As a method for cooling a slurry, etc., in the ambient atmosphere using a roller, Patent Literature 1 discloses a cooling roller characterized by providing a number of slits or holes on the cylinder wall of a cylindrical body, providing a partition plate inside the cylindrical body so as to allow the cylindrical body to slidably rotate with respect to the partition plate, and providing a cooling gas injection tube in one chamber partitioned by the partition plate. According to this configuration, it is possible to cool the slurry by spraying a large amount of cooling gas onto the slurry so as to conduct heat away from the slurry directly.

However, in order to maintain vacuum atmosphere, the use of such a large amount of cooling gas that directly removes heat is not permitted. For example, as a cooling method of a substrate during film formation, film formation on a substrate extending along a cylindrical can disposed on a channel of a conveyance system is widely employed. According to this method, it is possible to release heat to the cooling can with a large heat capacity by ensuring a thermal contact between the substrate and the cylindrical can, thus preventing an increase in the temperature of the substrate. Further, it is possible to maintain the temperature of the substrate to a specific cooling temperature. The substrate can be effectively cooled by a cooling can also in a region other than the film-forming region on the substrate-conveyance channel.

As a method for ensuring the thermal contact between the substrate and the cylindrical can, gas cooling can be employed. Patent Literature 2 discloses that, in an apparatus for forming a thin film on a web as a substrate, a gas is introduced into a region between the web and a support means. According to this configuration, it is possible to ensure heat conduction between the web and the support means, thus suppressing an increase in the temperature of the web.

On the other hand, a cooling belt can also be used instead of the cylindrical can as a means for cooling the substrate. In the case of film formation using obliquely incident components, it is advantageous to perform film formation onto the substrate running linearly, in view of material use efficiency. In that case, a cooling belt can be used effectively as a substrate cooling means Patent Literature 3 discloses a method for cooling a belt when used for conveying and cooling a substrate material. According to the method disclosed in Patent Literature 3, when using a cooling belt for improving thin film-forming efficiency in a thin film-forming apparatus that generates a thermal load, a cooling mechanism using two or more cooling belts or a liquid medium is provided inside the cooling belt in order to cool it further. This can enhance the cooling efficiency, which thus makes it possible to improve the properties of a magnetic tape such as electromagnetic conversion characteristics, and to improve the productivity significantly at the same time.

CITATION LIST

Patent Literature

Patent Literature 1: JP 60 (1985)-184424 U
Patent Literature 2: JP 1 (1989)-152262 A
Patent Literature 3: JP 6 (1994)-145982 A

SUMMARY OF INVENTION

Technical Problem

In order to improve the productivity of thin films, the enhancement of the film-forming rate, together with the improvement of the cooling efficiency, is necessary.

For increasing the cooling efficiency in gas cooling, it is effective to increase the pressure between a cooler body and a substrate. For example, the gap between the cooler body and the substrate needs to be reduced, while the amount of cooling gas needs to be increased, as much as possible. However, in the above-mentioned conventional configurations, when an increased amount of gas is introduced into the vacuum chamber, the degree of vacuum is reduced due to the cooling gas leaking from the gap between the cooler body and the substrate, leading to problems such as deterioration in the thin film quality and abnormal discharge. Therefore, the amount of gas to be introduced is limited. Further, the need to increase the size of the discharge pump causes a problem of an increase in the cost of equipment.

It is an object of the present invention to achieve gas cooling that is necessary for high-rate film formation while suppressing the reduction in the degree of vacuum, which solves the conventional problems.

Solution to Problem

That is, the present invention provides a thin film-manufacturing apparatus including: a vacuum chamber; a conveyance system disposed in the vacuum chamber so that an elongated substrate is conveyed from an unwinding position to a winding position; an opening provided facing a conveyance channel of the conveyance system; and a film-forming source for feeding a material to the substrate through the opening. In the thin film-manufacturing apparatus, the conveyance system includes a blowing roller having a function of conveying the substrate and a function of supplying a gas for cooling the substrate toward the substrate, and the blowing roller includes (i) a cylindrical first shell that has a cylindrical outer circumferential surface for supporting the substrate and a plurality of first through holes provided along the circumferential direction of the outer circumferential surface as a channel for supplying the gas, and that is rotatable in synchronization with the substrate, (ii) an internal block that is disposed inside the first shell, the rotation of the internal block in synchronization with the substrate being inhibited, (iii) a manifold that has a relatively large dimension in the radial direction of the first shell, and that is formed, as a space defined by the internal block inside the first shell so as to maintain the gas introduced from the outside of the vacuum chamber, to introduce the gas toward the plurality of first through holes within the range of a holding angle defined as an angle formed by the contact portion of the first shell and the substrate with the rotation axis of the first shell at the center, and (iv) a clearance that has a relatively small dimension in the radial direction, and that is formed, as a space formed inside the first shell, to introduce the gas toward the plurality of first through holes outside the range of the holding angle.

From another aspect, the present invention provides a thin film-manufacturing method including the steps of constructing a conveyance system for an elongated substrate in a vacuum chamber; conveying the elongated substrate from an unwinding position to a winding position in the conveyance system; and evaporating a material from a film-forming source toward an opening provided facing the conveyance channel of the conveyance system so that the material is fed onto the substrate. In the method, the conveyance system includes a blowing roller having a function of conveying the substrate and a function of supplying a gas for cooling the substrate toward the substrate, a first roller disposed on the upstream side of the blowing roller along the conveyance direction of the substrate, and a second roller disposed on the downstream side of the blowing roller along the conveyance direction of the substrate, and the blowing roller includes (i) a cylindrical first shell that has a cylindrical outer circumferential surface for supporting the substrate and a plurality of first through holes provided along the circumferential direction of the outer circumferential surface as a channel for supplying the gas, and that is rotatable in synchronization with the substrate, (ii) an internal block that is disposed inside the first shell, the rotation of the internal block in synchronization with the substrate being inhibited, (iii) a manifold that has a relatively large dimension in the radial direction of the first shell, and that is formed, as a space defined by the internal block inside the first shell so as to maintain the gas introduced from the outside of the vacuum chamber, to introduce the gas toward the plurality of first through holes within the range of a specific angle with the rotation axis of the first shell at the center, and (iv) a clearance that has a relatively small dimension in the radial direction, and that is formed, as a space formed inside the first shell, to introduce the gas toward the plurality of first through holes outside the range of the specific angle. In the thin film-manufacturing method, the first roller, the blowing roller, and the second roller are set to have a relative positional relationship, in the process of constructing the conveyance system, such that the specific angle should fall within the range of a holding angle defined as an angle formed by the contact portion of the first shell and the substrate.

From still another aspect, the present invention provides a substrate-conveying roller having a function of conveying a substrate under vacuum and a function of supplying a gas for cooling the substrate toward the substrate under vacuum. The substrate-conveying roller includes (i) a cylindrical first shell that has a cylindrical outer circumferential surface for supporting the substrate and a plurality of first through holes provided along the circumferential direction of the outer circumferential surface as a channel for supplying the gas, and that is rotatable in synchronization with the substrate, (ii) an internal block that is disposed inside the first shell, the rotation of the internal block in synchronization with the substrate being inhibited, (iii) a manifold that has a relatively large dimension in the radial direction of the first shell, and that is formed, as a space defined by the internal block inside the first shell so as to maintain the gas introduced from the outside of the vacuum chamber, to introduce the gas toward the plurality of first through holes within the range of a specific angle with the rotation axis of the first shell at the center, and (iv) a clearance that has a relatively small dimension in the radial direction, and that is formed, as a space formed inside the first shell, to introduce the gas toward the plurality of first through holes outside the range of the specific angle.

From still another aspect, the present invention provides a thin film-manufacturing apparatus including: a vacuum chamber; a conveyance system, disposed in the vacuum chamber, including a blowing roller having (i) a first shell that conveys a substrate along its surface, that rotates in synchronization with the substrate, and that has a plurality of through holes, (ii) an internal block that is disposed inside the first shell, and that does not rotate in synchronization with the substrate, (iii) a manifold, provided between the first shell and the internal block within the range of a holding angle where the first shell and the substrate are in contact, into which a gas for cooling the substrate is introduced, and (iv) a clearance, provided outside the range of the manifold, having a smaller space between the first shell and the internal block as compared to the manifold; an opening provided facing a conveyance channel in the conveyance system; and a film-forming source for feeding a material to the substrate through the opening.

Advantageous Effects of Invention

According to the present invention, cooling gas can be fed efficiently into the gap between the first shell and the substrate. Therefore, even if a reduced amount of cooling gas is introduced, the gas pressure between the first shell and the substrate can be kept high. Accordingly, it is possible to perform gas cooling for the substrate while suppressing the reduction in the degree of vacuum. In addition, a compact thin film-manufacturing apparatus can be achieved.

DESCRIPTION OF EMBODIMENTS

Hereinafter, an embodiment of the present invention is described with reference to the drawings.

Figure 1:
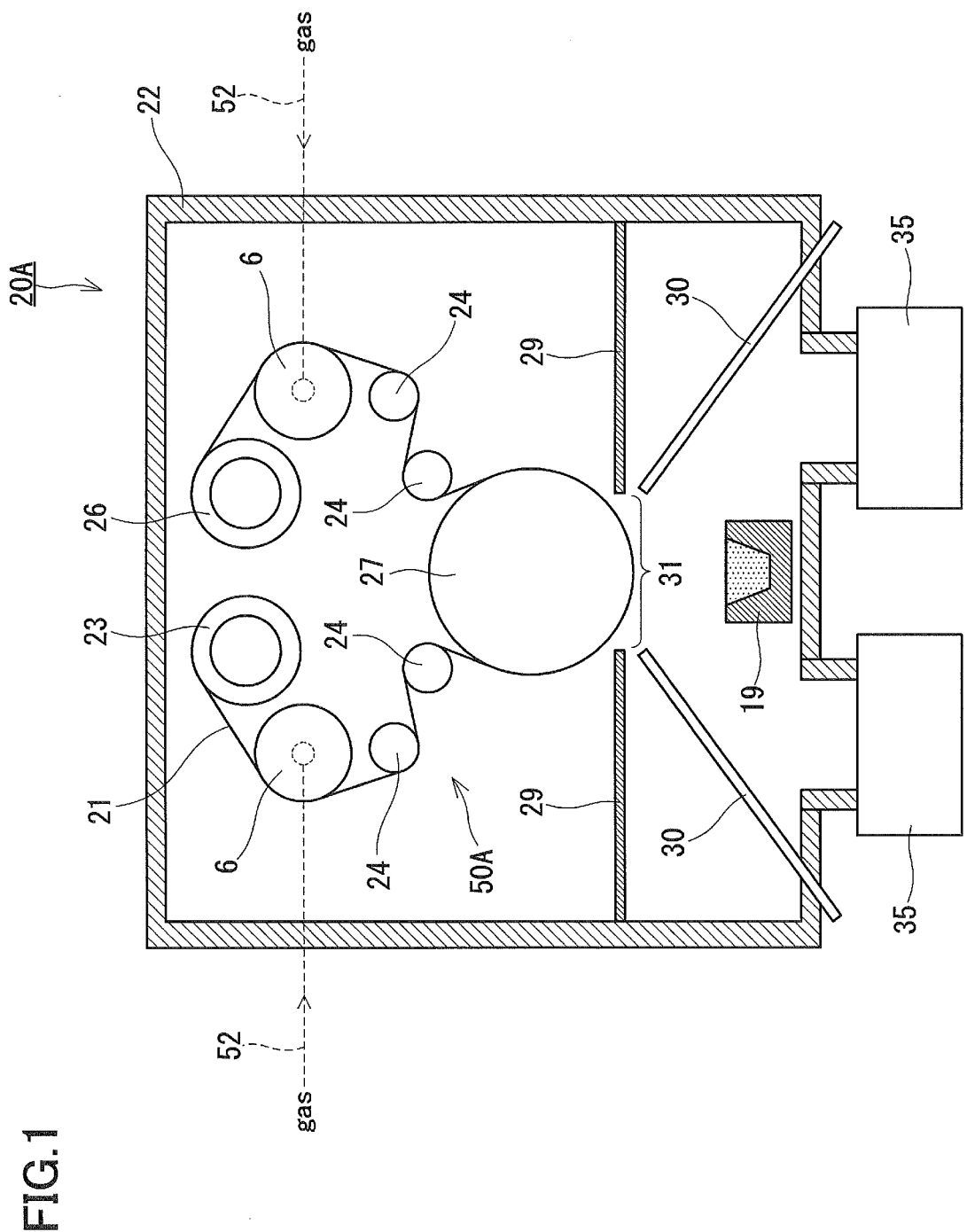
FIG. 1 is a schematic diagram of a film-forming apparatus showing an example of the embodiment of the present invention.

FIG. 1 schematically shows an example of the overall configuration of a film-forming apparatus. A film-forming apparatus 20A (thin film-manufacturing apparatus) includes a vacuum chamber 22, a conveyance system 50A, a film-forming source 19, a shield plate 29, raw material gas introduction tubes 30, and discharge pumps 35. The conveyance system 50A is composed of a spool roller 23, blowing rollers 6, conveying rollers 24, a can 27, and a spool roller 26. Each blowing roller 6 has a function of conveying a substrate 21 and a function of supplying a gas for cooling the substrate 21 toward the substrate 21. The blowing roller 6 is one of conveying rollers. A gas is supplied from the outside of the vacuum chamber 22 to the blowing rollers 6 through gas supply pipes 52.

The vacuum chamber 22 is a pressure-resistant container member having an internal space. The conveyance system 50A, the film-forming source 19, etc., are disposed in the internal space of the vacuum chamber 22. The spool roller 23 is a roller member rotatably provided around the axial core. The elongated substrate 21 in the form of a strip is wound on the surface of the spool roller 23. The spool roller 23 feeds the substrate 21 to the conveying roller that is closest to the spool roller 23 (blowing roller 6 in FIG. 1).

The discharge pumps 35 are provided outside the vacuum chamber 22 and bring the inside of the vacuum chamber 22 into a reduced pressure state suitable for thin film formation. The discharge pumps 35, for example, are composed of various vacuum discharge systems using an oil diffusion pump, a cryopump, a turbo-molecular pump, or the like, as a main pump.

As the substrate 21, various metal foils, various polymeric films, composites of polymeric films and metal foils, or the like, can be used. Examples of the metal foils include aluminum foil, copper foil, nickel foil, titanium foil, and stainless foil. Examples of the polymeric films include polyethylene terephthalate, polyethylene naphthalate, polyamide, and polyimide. However, the material of the substrate 21 is not specifically limited. An elongated substrate that is not limited to the above-mentioned materials can be used as the substrate 21.

The width of the substrate 21, for example, is 50 to 1000 mm. A desirable thickness of the substrate 21, for example, is 3 to 150 μm. In the case where the width of the substrate 21 is less than 50 mm, the loss of gas in the width direction of the substrate 21 during gas cooling is large, which however does not mean that the present invention cannot be applied to that case. In the case where the thickness of the substrate 21 is less than 3 μm, thermal deformation tends to occur because of exceptionally small heat capacity of the substrate 21. However, both facts do not show non-applicability of the present invention to such a case.

The conveyance speed of the substrate 21, for example, is 0.1 to 500 m/minute, though it differs depending on the type of thin film to be produced and the film-forming conditions thereof. The tension to be applied to the substrate 21 during conveyance can be appropriately adjusted by the conditions such as the material of the substrate 21, the thickness of the substrate 21, and the film film-forming rate.

The conveying rollers 24 each are a roller member rotatably provided around the axial core. The conveying rollers 24 guide the substrate 21 fed from the spool roller 23 to the film-forming region, and finally to the spool roller 26. When the substrate 21 runs along the can 27 facing an opening 31 provided in the film-forming region, material particles coming from the film-forming source 19 are deposited on the substrate 21, while being reacted with a raw material gas introduced through the raw material gas introduction tubes 30, as needed, to form a thin film on the surface of the substrate 21. The spool roller 26 is a roller member provided so as to be driven to rotate by a drive means (for example, a motor), which is not shown, and serves to wind the substrate 21 on which a thin film has been formed and to store it.

As the film-forming source 19, various film-forming sources can be used. For example, CVD sources, sputtering sources, ion-plating sources, and evaporation sources using resistance heating, induction heating, electron beam heating, etc., can be used. Further, it is also possible to combine ion sources or plasma sources for use with the film-forming source 19. For example, the film-forming source 19 is provided vertically below the opening 31. The film-forming source 19 is a container member the upper part of which is open. Specific examples thereof include an evaporation crucible. A material is placed inside the evaporation crucible. A heating means such as an electron gun is provided in the vicinity of the film-forming source 19. The material inside the evaporation crucible is heated by electron beams, etc., from the electron gun to be evaporated. The vapor of the material moves vertically upward, and adheres onto the surface of the substrate 21 while passing through the opening 31. Thus, a thin film is formed on the surface of the substrate 21.

The shield plate 29 limits the region in which the material particles coming from the film-forming source 19 are in contact with the substrate 21 only to the opening 31.

The film-forming apparatus 20A may further include a means for introducing a film-forming gas for reactive film formation in the vacuum chamber 22. Examples of the means for introducing the film-forming gas include the raw material gas introduction tubes 30 shown in FIG. 1. The raw material gas introduction tubes 30 each, for example, are a tubular member with one end being arranged vertically above the film-forming source 19 and the other end being connected to a means for supplying a film-forming reaction gas, which is not shown, provided outside the vacuum chamber 22. It serves to supply, for example, oxygen, nitrogen, etc., to the vapor of the material. Thus, a thin film that contains an oxide, nitride, or oxynitride of the material coming from the film-forming source 19 as a main component (component with the largest mass ratio) is formed on the surface of the substrate 21. Examples of the means for supplying a film-forming reaction gas include a gas cylinder, a gas generating device, etc.

The substrate 21 on which a thin film has been formed is wound by the spool roller 26 after running on other conveying rollers 24.

Figure 4:
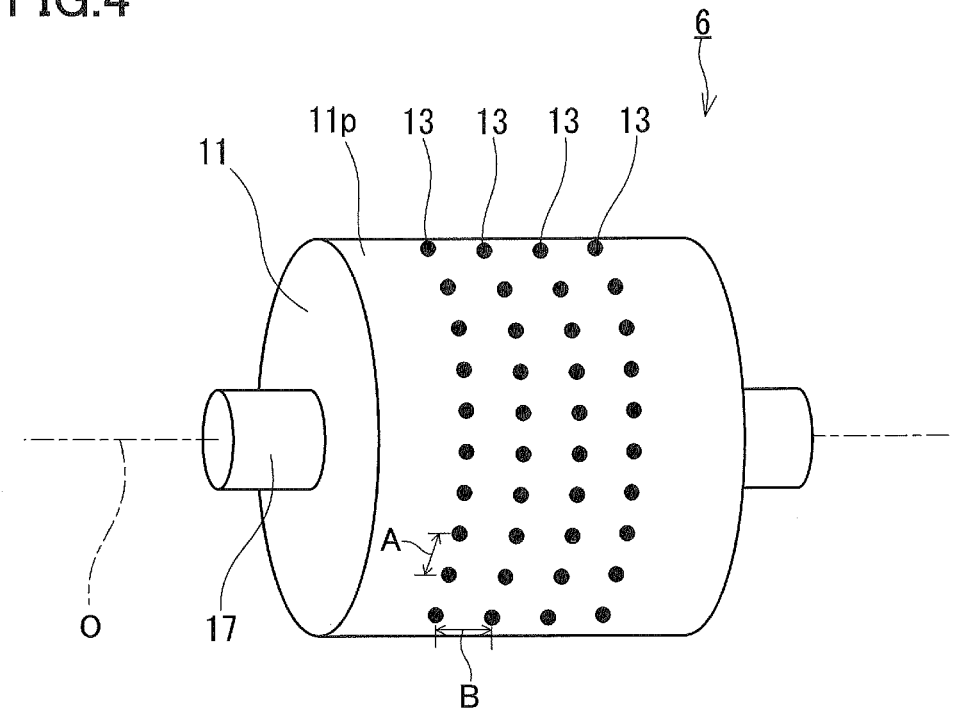
FIG. 4 is a perspective view of a blowing roller.
Figure 5:
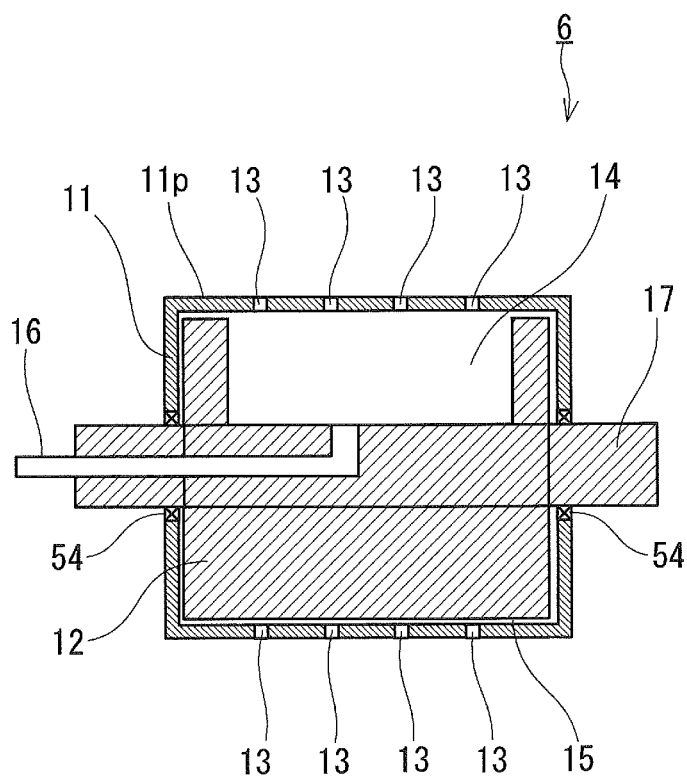
FIG. 5 is a vertical sectional view of the blowing roller.
Figure 6:
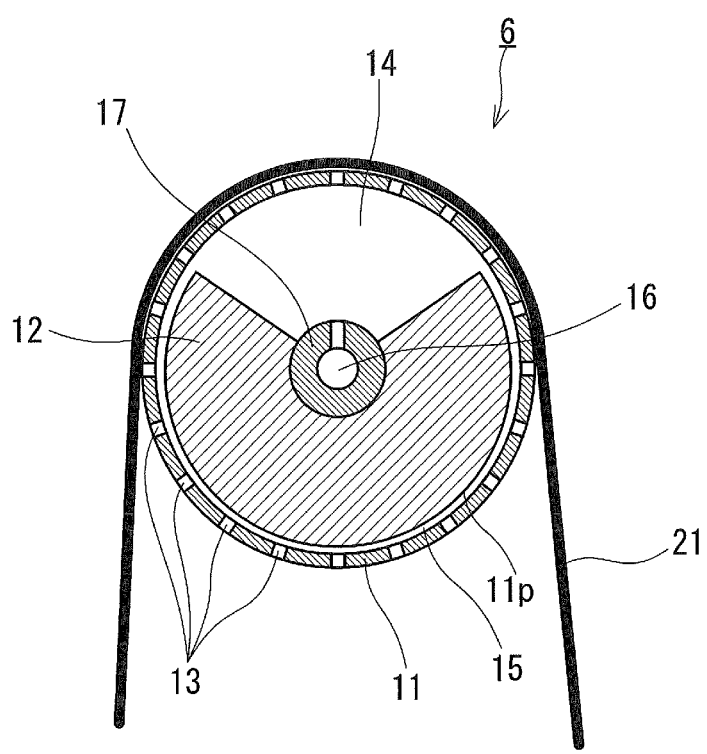
FIG. 6 is a horizontal sectional view of the blowing roller.

The blowing roller 6 is provided in the course of the substrate conveyance channel from the spool roller 23 to the spool roller 26. The substrate 21 is cooled by the blowing roller 6. Only one blowing roller 6 may be provided in the conveyance system 50A, or a plurality of blowing rollers 6 may be provided in the conveyance system 50A as this embodiment. Further, the blowing roller 6 may be provided at a position such that the substrate 21 before film formation can be cooled, or may be provided at a position such that the substrate 21 after the film formation can be cooled. FIG. 4 shows a perspective view of the blowing roller 6. FIG. 5 shows a vertical sectional view of the blowing roller 6. FIG. 6 shows a horizontal sectional view of the blowing roller 6.

The blowing roller 6 has an external shell 11 (first shell) that rotates in synchronization with the substrate 21 and an internal block 12 whose rotation in synchronization with the substrate 21 is inhibited. The external shell 11 is formed with a plurality of through holes 13. For example, the external shell 11 is in the form of a hollow cylinder, in the hollow portion of which the internal block 12 is disposed. The diameter of the external shell 11, for example, is 40 to 1000 mm. The larger the external shell 11, it is easier to obtain cooling performance, but the volume occupied by the external shell 11 in the vacuum chamber 22 increases when the size thereof is excessively large, which may result in an increase in the size of the film-forming apparatus 20A, leading to an increase in the cost of equipment. Further, as the diameter increases, the absolute value of deformation due to thermal expansion increases and thus it becomes difficult to maintain the accuracy of the clearance between the external shell 11 and the internal block 12 when the length of the external shell 11 in the direction parallel to the rotation axis O (width direction) is large. On the other hand, as the diameter of the external shell 11 decreases, it becomes difficult to ensure the processing accuracy in grinding the inner circumferential surface of the external shell 11. The length in the width direction (width) of the external shell 11 is set larger than the width of the substrate 21 for stable running. The width of the external shell 11, for example, is 100 to 800 mm, depending on the width of the substrate 21. The thickness of the external shell 11 in the region formed with the through holes 13, for example, is 2 to 15 mm. When the thickness is small, the deformation of the external shell 11 tends to occur due to the tension applied to the substrate 21. When the external shell 11 is thick, processing to form the through holes 13 is rendered difficult.

As shown in FIG. 4, the diameter of the through holes 13, a hole pitch A in the rotation direction, and a hole pitch B in the axis direction are appropriately set, depending on the vacuum conditions or cooling conditions of the substrate 21. The diameter of the through holes 13, for example, is 0.5 to 3 mm. When the through holes 13 have an excessively large diameter, the leakage of cooling gas increases. Conversely, when the through holes 13 have a small diameter, processing to form the through holes 13 is rendered difficult. The hole pitch A, for example, is 10 to 50 mm. The hole pitch A, for example, may also be about 5 to 30 degrees, in terms of an angular pitch in the rotation direction of the external shell 11. When the hole pitch A is small, the number of holes to be processed increases, resulting in an increase in the cost of equipment. When the hole pitch A is excessively large, the fluctuation in pressure depending on the rotational position of the external shell 11 increases, and thus the uniformity of the cooling performance decreases. The hole pitch B, for example, is 10 to 200 mm. The hole pitch B is not necessarily a uniform pitch in the width direction, and can be appropriately adjusted depending on the temperature and cooling state of the substrate 21. When the hole pitch B is small, the number of holes to be processed increases, resulting in an increase in the cost of equipment. However, when the hole pitch B is excessively large, the uniformity of the cooling performance in the width direction decreases.

Between the external shell 11 and the internal block 12, a manifold 14 into which the gas is introduced and a clearance 15 provided outside the range of the manifold 14 are formed. The manifold 14 is at least one hollow space formed between the external shell 11 and the internal block 12. It is also possible to form the manifold 14 by connecting a plurality of hollow spaces. The manifold 14, for example, is formed by hollowing a part of the internal block 12, and is connected to the through holes 13 of the external shell 11 and a gas flow path 16 (gas introduction port). The cooling gas introduced through the gas flow path 16 is supplied to the through holes 13 via the manifold 14. It is possible to introduce the cooling gas into the through holes 13 with high conductance by setting the distance between the external shell 11 and the internal block 12 in the manifold 14, for example, to 5 mm or more.

The distance between the external shell 11 and the internal block 12 in the clearance 15 is set smaller than that in the manifold 14. The distance, for example, is 30 µm to 200 µm. That is, the dimension of the clearance 15 in the radial direction of the external shell 11 is smaller than that of in the manifold 14 in the radial direction. When the distance is excessively large, the amount of cooling gas leaking through the through holes 13 via the clearance 15 increases, which reduces the degree of vacuum. When the distance is excessively small, the external shell 11 and the internal block 12 may be brought into contact due to poor processing accuracy, deformation caused by thermal expansion, etc., which increases the risk of abnormal rotation or damage to the blowing roller 6.

The manifold 14 is defined inside the range of the holding angle where the substrate 21 is in contact with the blowing roller 6. This makes it easier to confine the cooling gas released through the through holes 13 via the manifold 14 into the gap between the external shell 11 and the substrate 21. Further preferably, the manifold 14 is defined within a range that is shifted from each of both ends of the range of the holding angle toward the inside by at least the hole pitch A.

This makes it far easier to confine the cooling gas released through the through holes 13 via the manifold 14 into the gap between the external shell 11 and the substrate 21.

Further, a gas leakage-reducing member closely facing the outer circumferential surface of the external shell 11 may be provided. This can further decrease the leakage of cooling gas outside the range of the holding angle. The gas leakage-reducing member, for example, is a curved plate disposed at a position close to the external shell 11 and at a distance about 50 to 300 μm therefrom outside the range of the holding angle.

Figure 9:
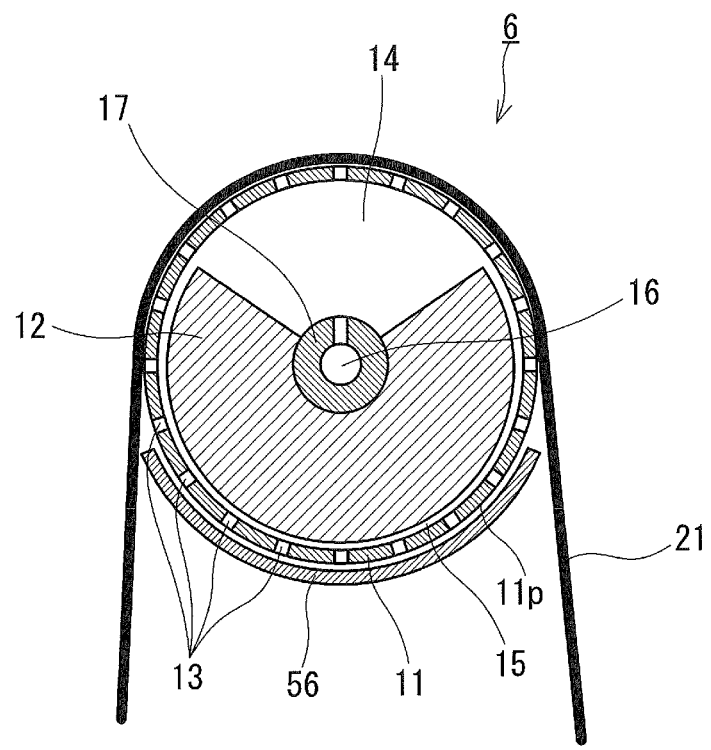
FIG. 9 is a schematic diagram showing the position and shape of a gas leakage-reducing member.

As shown in FIG. 9, the gas leakage-reducing member 56, for example, has an arcuate shape along the outer circumferential surface 11p of the first shell 11. The gas leakage-reducing member 56 can be provided at a position facing the outer circumferential surface 11p of the first shell 11 outside the range of the holding angle.

The above-mentioned structure of the blowing roller 6 allows the through holes 13 of the external shell 11 to move with the rotation of the external shell 11, facing the manifold 14 and the clearance 15. The conductance from the gas flow path 16 to the through holes 13 is far larger via the manifold 14 than via the clearance 15. Therefore, the amount of cooling gas that passes outwardly through the through holes 13 when facing the manifold 14 is larger than the amount of cooling gas that passes through the through holes 13 when facing the clearance 15, in the absence of the substrate 21. Accordingly, the cooling gas can be released efficiently through the through holes 13 within the range of the holding angle, and thus the cooling gas pressure between the external shell 11 and the substrate 21 can be kept high.

In the presence of the substrate 21, the cooling gas at high pressure is present between the external shell 11 and the substrate 21 within the range of the holding angle, and therefore the external shell 11 can receive heat efficiently from the substrate 21. On the other hand, outside the range of the holding angle, the external shell 11 is present close to the internal block 12, and the cooling gas is maintained between the external shell 11 and the internal block 12. Therefore, the external shell 11 is efficiently cooled by the internal block 12. In this way, the external shell 11 periodically repeats cooling the substrate 21 and releasing heat into the internal block 12 with the rotation of the external shell 11, and thus can maintain stable cooling operation for a long period of time.

Further, when the gas is introduced into the manifold 14, the average pressure of the gap between the substrate 21 and the outer circumferential surface 11p of the external shell 11 is lower, for example, than the atmospheric pressure. Furthermore, the variation, depending on whether or not the gas is introduced, in the distance between the substrate 21 and the outer circumferential surface 11p of the external shell 11 may be 100 μm or less. Moreover, the buoyancy caused by the average pressure of the gap between the substrate 21 and the outer circumferential surface 11p of the external shell 11 may be smaller than the normal force of the substrate 21 to the blowing roller 6 caused by the conveyance tension of the substrate 21.

The amount of cooling gas that leaks through the gap between the substrate 21 and the outer circumferential surface 11p of the external shell 11 can be reduced by setting the average pressure of the gap between the substrate 21 and the outer circumferential surface 11p of the external shell 11 lower than the atmospheric pressure at the time of introducing the cooling gas. Therefore, the load on the discharge pumps 35 can be reduced.

It should be noted that the variation in the distance between the external shell 11 and the substrate 21 can be measured using a laser displacement meter. Such a laser displacement meter can measure the distance from the measuring head of the laser displacement meter to an object. In the absence of the substrate 21, the distance from the measuring head to the external shell 11 is constant. In the presence of the substrate 21, the distance from the measuring head to the external shell 11 varies. The distance between the external shell 11 and the substrate 21 can be calculated by subtracting the measured value obtained in the presence of the substrate 21 and the thickness of the substrate 21 from the measured value obtained in the absence of the substrate 21.

The term "average pressure" means an average pressure within the range of the substrate 21 at the holding angle, and can be theoretically calculated using the conductance, the supply pressure of the gas, and the flow rate of the gas. The conductance is determined depending on the shape of the gas flow path (the diameter of the through holes, the length of the through holes, the dimensions of the manifold, etc.) and the gap distribution between the external shell 11 and the substrate 21.

Further, it can be estimated that the buoyancy caused by the average pressure of the gap between the substrate 21 and the outer circumferential surface 11p of the external shell 11 is smaller than the normal force of the substrate 21 to the blowing roller 6 caused by the conveyance tension of the substrate 21 when unevenness in the rotation of the external shell 11 exceeds a threshold, or the rotational speed of the external shell 11 falls below a threshold. The rotation of the external shell 11 can be measured using a velocimeter. The velocimeter, for example, is composed of a rubber roller and a rotary encoder.

According to this embodiment, the gas pressure between the blowing roller 6 and the substrate 21 can be kept high, even if a reduced amount of cooling gas is introduced. Further, a compact cooling function is made feasible, which can suppress an increase in size and cost of equipment.

Next, the structure of the blowing roller 6 of this embodiment is described further in detail.

As shown in FIG. 4 to FIG. 6, the blowing roller 6 includes the cylindrical first shell 11, the internal block 12 disposed inside the first shell 11, and a support body 17 securing the internal block 12. The manifold 14 and the clearance 15 are formed inside the first shell 11.

The first shell 11 has the cylindrical outer circumferential surface 11p for supporting the substrate 21, and a plurality of through holes 13 (first through holes) provided along the circumferential direction of the outer circumferential surface 11p. The first through holes 13 each serve as a channel for supplying the gas from the manifold 14 to the substrate 21. The first shell 11 is configured to rotate in synchronization with the substrate 21. Specifically, bearings 54 can be provided at both respective ends of the first shell 11, as shown in FIG. 5. The bearings 54 can rotatably connect the first shell 11 to the support body 17.

The internal block 12 is a member whose rotation in synchronization with the substrate 21 is inhibited. In this embodiment, the internal block 12 is secured to the support body 17. The support body 17, for example, is secured to the vacuum chamber 22. That is, the position and posture of the internal block 12 are fixed with respect to the vacuum chamber 22.

The manifold 14 is a space defined by the internal block 12 inside the first shell 11 so as to maintain the gas introduced from the outside of the vacuum chamber 22. The manifold 14 is formed so as to introduce the gas toward the plurality of first through holes 13 within the range of the holding angle. The manifold 14 has a relatively large dimension in the radial direction of the first shell 11. Accordingly, as mentioned above, a comparatively high gas pressure can be maintained between the first shell 11 and the substrate 21.

The phrase "within the range of the holding angle" means to include the case where one end or both ends of the range of the holding angle coincide with one end or both ends of the range of the manifold 14, in the circumferential direction of the first shell 11. Here, the term "coincide" does not mean to be coincident completely. For example, one end or both ends of the range of the holding angle are deemed to coincide with one end or both ends of the range of the manifold 14, even if the manifold 14 exceeds the range of the holding angle by about 2 to 3 degrees in terms of the rotation angle of the first shell 11, which is just within the margin of error.

The clearance 15 is also a space formed inside the first shell 11 and is formed so as to introduce the gas toward the plurality of first through holes 13 outside the range of the holding angle. The clearance 15 has a relatively small dimension in the radial direction of the first shell 11.

Figure 7:
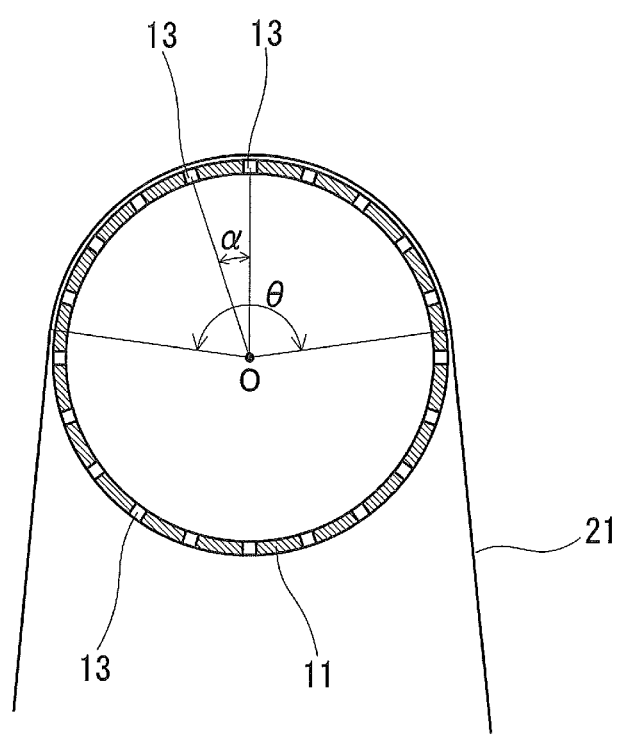
FIG. 7 is an explanatory diagram of a holding angle.

As shown in FIG. 7, the "holding angle" is defined as the angle θ formed by the contact portion between the first shell 11 and the substrate 21, with the rotation axis O of the first shell 11 at the center. The degree of the holding angle is not specifically limited. For example, when the holding angle falls within the range of 30 to 180 degrees (or 45 to 120 degrees), it is possible to convey the substrate 21 smoothly without generating excessive bending stress even in the case of the first shell 11 having a small diameter to some extent.

The conveyance system 50A includes a first roller disposed on the upstream side of the blowing roller 6 along the conveyance direction of the substrate 21 and a second roller disposed on the downstream side of the blowing roller 6 along the conveyance direction of the substrate. The holding angle is defined by a relative positional relationship of the first roller, the blowing roller 6, and the second roller. In the film-forming apparatus 20A shown in FIG. 1, the "first roller" is the spool roller 23 or a conveying roller 24. The "second roller" is a conveying roller 24 or the spool roller 26. Here, it is supposed that the manifold 14 is formed so as to introduce the gas toward the plurality of first through holes 13 within the range of a specific angle with the rotation axis O of the first shell 11 at the center. The conveyance system 50A can be constructed so that the "specific angle" falls within the range of the holding angle.

For the thin film production, the conveyance system 50A is first constructed inside the vacuum chamber 22. Then, the substrate 21 is conveyed from an unwinding position (spool roller 23) to a winding position (spool roller 26) in the conveyance system 50A. A material is evaporated from the film-forming source 19 toward the opening 31 provided facing the conveyance channel in the conveyance system 50A so that the material is fed onto the substrate 21. In the process of constructing the conveyance system 50A, the first roller (spool roller 23), the blowing roller 6 and the second roller (conveying roller 24) are set to have a relative positional relationship such that the "specific angle" falls within the range of the holding angle.

As shown in FIG. 7, the holding angle defined by the angle θ is larger than the angle α formed by the two lines obtained by connecting the rotation axis O of the first shell 11 with each center point of two first through holes 13 that are adjacent to each other in the circumferential direction. This relationship allows at least one of the plurality of first through holes 13 to face the manifold 14 without fail.

In this embodiment, the range (angular range) of the manifold 14 in the circumferential direction is defined so that the manifold 14 faces the plurality of first through holes 13 only within the range of the holding angle. Such a configuration facilitates maintaining a high gas pressure between the first shell 11 and the substrate 21.

As shown in FIG. 6, the internal block 12 has an arcuate outer circumferential surface outside the range of the holding angle. The clearance 15 is formed between the arcuate outer circumferential surface of the internal block 11 and the inner circumferential surface of the first shell 11. This configuration makes it easy to keep the dimension of the clearance 15 constant. That is, the dimension of the clearance 15 may be constant. The range where the dimension is constant can be regarded as the clearance 15, and the other range can be regarded as the manifold 14.

As shown in FIG. 6, the plurality of first through holes 13 are formed at equal intervals along the circumferential direction. This can ensure the uniformity of the cooling performance in the circumferential direction.

Figure 8:
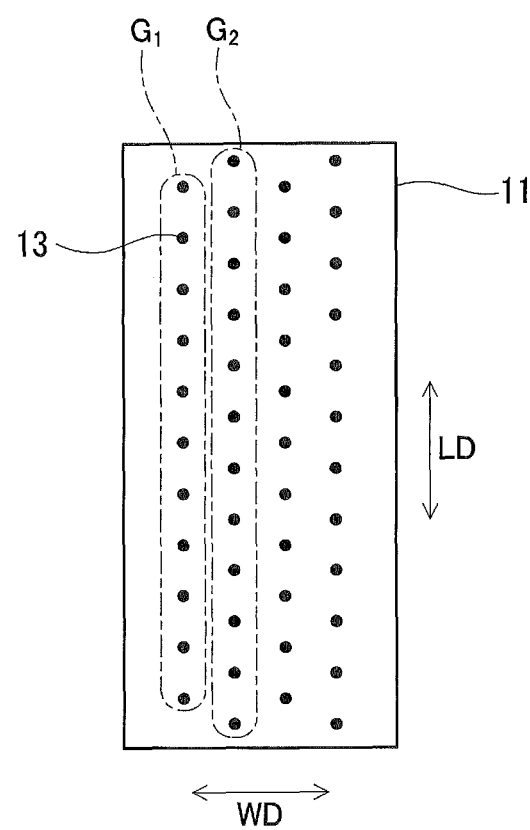
FIG. 8 is a development view of a first shell.

FIG. 8 is a development view of the first shell 11. The plurality of first through holes 13 constitute (i) a first group $G_1$ provided along the circumferential direction LD at a specific position in the width direction WD parallel to the rotation axis O, and (ii) a second group $G_2$ provided along the circumferential direction LD at a position adjacent to the specific position in the width direction WD. The plurality of first through holes 13 belonging to the first group $G_1$ and the plurality of first through holes 13 belonging to the second group $G_2$ form a staggered arrangement. Such an arrangement of the first through holes 13 enables more uniform cooling to be achieved. However, the arrangement of the plurality of the first through holes 13 is not specifically limited, and the plurality of the first through holes 13, for example, may be formed into a grid pattern.

As shown in FIG. 5, the support body 17 has the gas flow path 16 (gas introduction port) for introducing the gas from the outside of the vacuum chamber 22 into the manifold 14. The support body 17 and the internal block 12 are not necessarily composed of separate parts. A part of the internal block 12 may project from the first shell 11, and the projecting portion may function as the support body 17.

For example, the blowing roller 6 is configured so that the external shell 11 has a diameter of 120 mm, a width of 120 mm, and a thickness of 6.5 mm, the through holes 13 have a diameter of 1 mm and are arranged in three rows with the hole pitch A set to 20 degrees and the hole pitch B set to 38 mm, and the distance between the external shell 11 and the internal block 12 in the clearance 15 is 100 μm. In this regard, gas cooling performance equivalent to that in the case of introducing helium gas into the vacuum chamber 22 without introducing the gas through the gas flow path 16 so that the vacuum chamber 22 is entirely maintained at 100 Pa can be obtained by introducing helium gas at a flow rate of 73 sccm (Standard Cubic Centimeter per Minute) as a cooling gas through the gas flow path 16. The heat transfer coefficient can be calculated by measuring the temperature of the substrate 21 running on the surface of the blowing roller 6 using a thermocouple, etc., from the running time and variation in the temperature of the substrate 21. The heat transfer coefficient resulting from gas cooling, for example, is 0.003 W/cm$^2$/K, though it also depends on the type of the substrate 21. In this case, for example, helium gas needs to be introduced at about 680 sccm just by introducing a structure to create a differential pressure into a part of the vacuum chamber 22. The blowing roller 6 can reduce the necessary gas introduction rate to about ⅑.

As described above, in the film-forming apparatus 20A, the substrate 21 fed from the spool roller 23 runs via the conveying rollers 24 to be wound up on the spool roller 26. In the course of the process, the substrate 21 is supplied, facing the opening 31, with the vapor coming from the film-forming source 19 and oxygen, nitrogen, etc., if needed, so that a thin film is formed the substrate 21, while the substrate 21 is cooled by the blowing rollers 6. Through such operation, the film-forming apparatus 20A can perform take-up film formation in which an increase in the temperature of the substrate 21 is suppressed.

Figure 2:
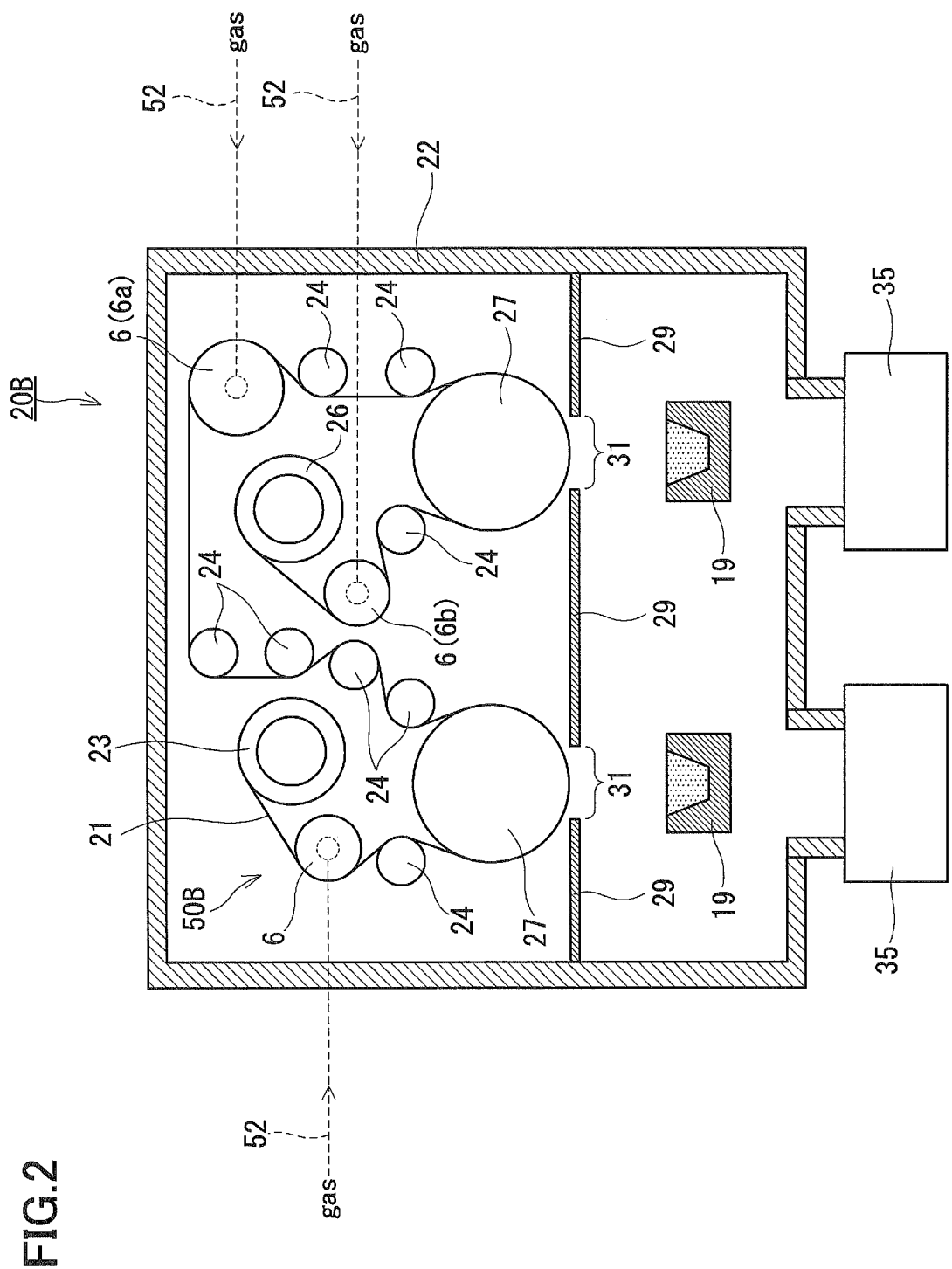
FIG. 2 is a schematic diagram of a film-forming apparatus showing another example of the embodiment of the present invention.

FIG. 2 is a schematic diagram of a film-forming apparatus showing another example of the embodiment of the present invention. In FIG. 2, the same reference numerals are used for the same components as in FIG. 1 and the descriptions thereof are omitted. A film-forming apparatus 20B, for example, allows a negative electrode for lithium ion secondary batteries to be formed. It should be noted that the specific numerical values shown below are just an example, and the present invention is not limited to these at all.

As the substrate 21, a surface-roughened copper foil (thickness: 18 μm; width: 100 mm), manufactured by Furukawa Circuit Foil Co., Ltd., that serves as a current collector is used, and a silicon multilayer thin film is formed by vacuum evaporation to a thickness of 8 μm on each of both sides of the current collector. The air inside the vacuum chamber 22, provided with two 14 inch-bore oil diffusion pumps that serve as the discharge pumps 35, having a volume of 0.4 $m^3$ is displaced to 0.002 Pa, and thereafter silicon as a film-forming material is melted. Silicon is melted using an electron beam evaporation source with 270-degree deflection (film-forming source 19) manufactured by JEOL Ltd. The molten silicon is irradiated with an electron beam generated by an acceleration voltage of −10 kV and an emission current of 520 to 700 mA, and then the generated vapor is directed toward the substrate 21 running along the can 27.

A metal mask (having an opening length of 100 mm), which is not shown, is provided at a position of about 2 mm from the substrate 21 so that the silicon thin film is formed to a width of 85 mm. A conveyance system 50B is configured to allow the substrate 21 to be conveyed reciprocatingly. One cycle of conveyance allows one layer of silicon thin film with a film thickness of about 0.5 μm to be formed on each of both sides of the substrate 21. With reciprocating conveyance, the film formation is repeated 16 times, so that a silicon thin film of about 8 μm is formed.

The formation of the respective layers on both sides of the substrate 21 is performed, for example, with an average emission current of 600 mA, a substrate-conveying speed of 2 m/minute, and an average film-forming rate of 80 nm/second.

A blowing roller 6a is provided on the conveyance channel after a silicon thin film is formed on one surface (first surface) of the substrate 21 before the film formation on the other surface (second surface). The blowing roller 6a is configured so that the external shell 11 has a diameter of 120 mm, a length in the axis direction of 120 mm, and a thickness of 4 mm, the through holes 13 have a diameter of 1 mm and are arranged in three rows with the hole pitch A set to 20 mm and the hole pitch B set to 30 mm, and the distance between the external shell 11 and the internal block 12 in the clearance 15 is 80 μm. Argon gas is introduced at 80 sccm as a cooling gas through the gas flow path 16. This configuration allows the substrate 21 to be maintained at almost constant temperature at the times of starting the film formation on the respective surfaces of the substrate 21. By achieving uniform temperature on both sides of the substrate 21 at the times of starting the film formation, the warpage of the substrate 21 after the film formation resulting from the difference in the thermal expansion coefficient, etc., can be reduced as well as the qualities of thin films can be made consistent. Further, the maximum temperature of the substrate 21 can be lowered by suppressing the temperature of the substrate 21 at the time of starting the film formation on the second surface to a low level, and thus the deterioration of the substrate 21 can be prevented. As an example, in the case of forming a silicon thin film on a copper foil substrate as a polar plate for batteries, the deterioration of the copper foil due to the temperature increase can be evaluated, for example, from the change in the mechanical properties according to a drawing test, etc. A thermally deteriorated copper foil reveals phenomena such as an increase in extension due to a drawing load, and a decrease in fracture strength. Such deterioration in the properties leads to deformation or fracture of the polar plate because the silicon thin film used as the polar plate for lithium secondary batteries expands during the absorption of lithium.

In addition, a blowing roller 6b is provided in the course after the completion of the film formation, in the respective conveyance cycles of the substrate 21, before reaching the spool roller 26. This configuration allows a reduction in the temperature of the substrate 21 when being wound to almost room temperature. By reducing the temperature of the substrate 21 when being wound to almost room temperature, the occurrence of wrinkles due to thermal deformation of the substrate 21 when being wound can be prevented, and a buckling phenomenon due to the contraction of the substrate 21 after being wound can also be prevented. The blowing roller 6b is configured so that the external shell 11 has a diameter of 80 mm, a length in the axis direction of 120 mm, and a thickness of 3 mm, the through holes 13 have a diameter of 1 mm and are arranged in three rows with the hole pitch A set to 15 mm and the hole pitch B set to 30 mm, and the distance between the external shell 11 and the internal block 12 in the clearance 15 is 50 μm. Argon gas is introduced at 50 sccm as a cooling gas through the gas flow path 16.

In the film-forming apparatus 20B shown in FIG. 2, the opening 31 is provided at each of two points on the conveyance channel so that a thin film is formed on the first surface of the substrate 21 in the first film-forming region of the conveyance channel, and thereafter a thin film is formed on the second surface of the substrate 21 in the second film-forming region located on the downstream side of the first film-forming region. The conveyance system 50B is constructed so that the substrate 21 is cooled by running on the blowing roller 6 (6a) after passing through the first film-forming region before reaching the second film-forming region. This can be applied to a film-forming apparatus 20C shown in FIG. 3 in the same manner.

Figure 3:
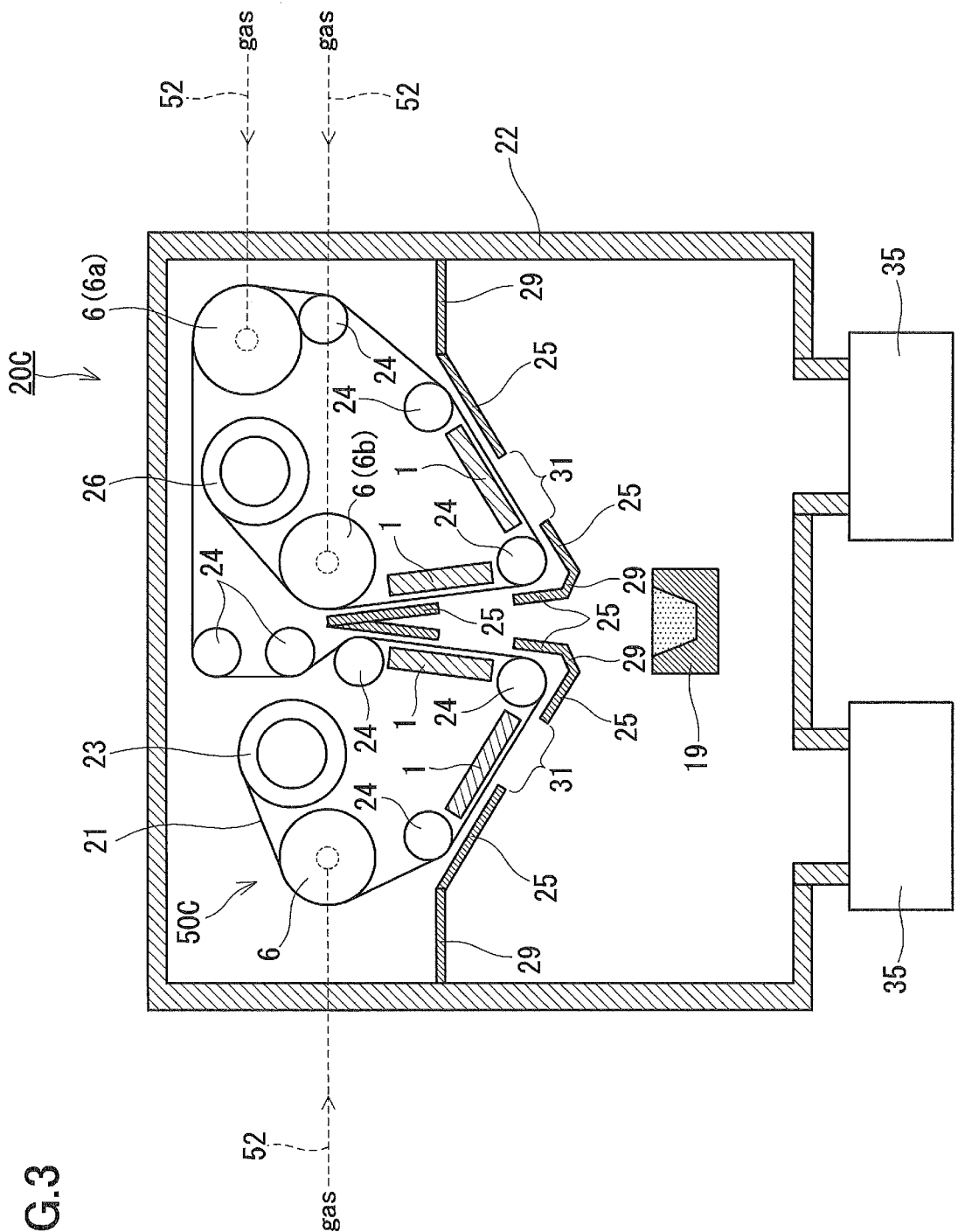
FIG. 3 is a schematic diagram of a film-forming apparatus showing still another example of the embodiment of the present invention.

FIG. 3 is a schematic diagram of a film-forming apparatus showing still another example of the embodiment of the present invention. In FIG. 3, the same reference numerals are used for the same components as in FIG. 1 and FIG. 2, and the descriptions thereof are omitted. A film-forming apparatus 20C, for example, allows a negative electrode for lithium ion secondary batteries to be formed.

As the substrate 21, a surface-roughened copper foil (thickness: 18 μm; width: 200 mm), manufactured by Furukawa Circuit Foil Co., Ltd., that serves as a current collector is used, and a silicon oxide multilayer thin film is formed by vacuum evaporation to a thickness of 15 μm on each of both sides of the current collector. The air inside the vacuum chamber 22, provided with two 14 inch-bore oil diffusion pumps that serve as the discharge pumps 35, having a volume of 0.4 $m^3$ is displaced to 0.002 Pa, and thereafter silicon as a film-forming material is melted. Silicon is melted using an electron beam evaporation source with 270-degree deflection (film-forming source 19) manufactured by JEOL Ltd. The molten silicon is irradiated with an electron beam generated by an acceleration voltage of −10 kV and an emission current of 950 mA, and then the generated vapor is directed toward the substrate 21.

The substrate 21 moves at a position of about 0.5 mm from a cooler body 1 cooled by cooling water at 10° C. While the substrate 21 is moving along the cooler body 1, a silicon thin film is formed thereon. The length of the cooler body 1 in the width direction of the substrate 21 is 90 mm.

Figure 10:
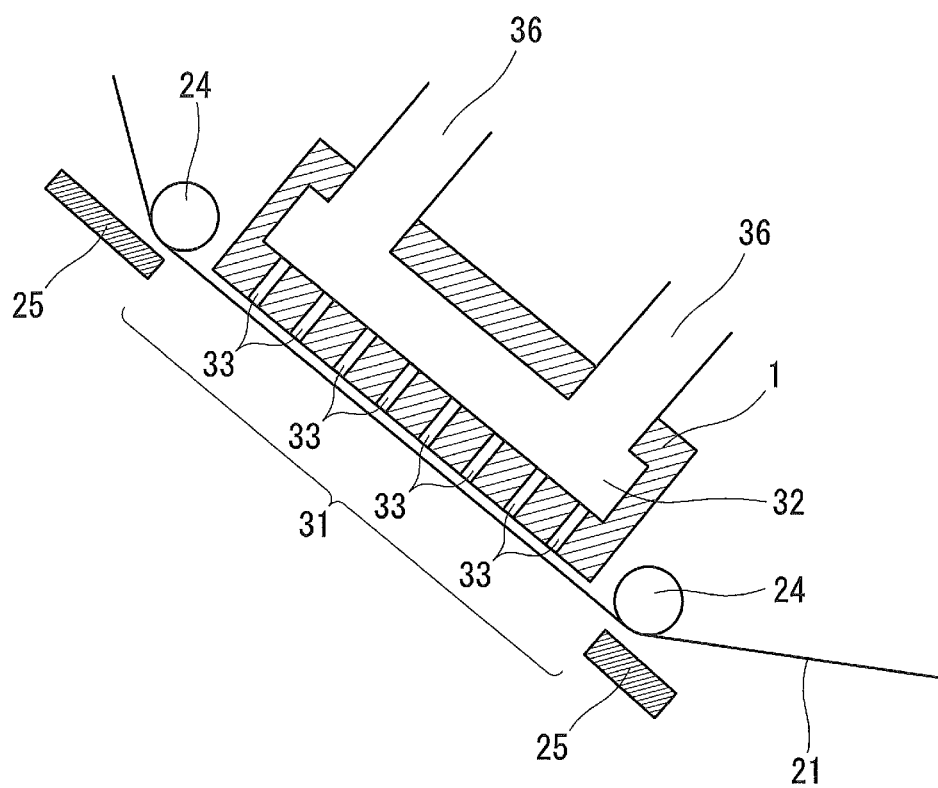
FIG. 10 is a cross sectional schematic diagram showing an example of a method for introducing gas into the gap between a cooler body and a substrate.

The cooler body 1 is composed of aluminium. As shown in the cross sectional schematic diagram of FIG. 10, cooling gas inlets 36 and a manifold 32 are provided in the cooler body 1 so as to introduce the gas into the gap between the cooler body 1 and the substrate 21. Pores 33 extending from the manifold 32 to the surface of the cooler body 1 are formed, and the gas is supplied through the pores 33 to the gap between the cooler body 1 and the substrate 21.

A metal mask 25 (having a length of each opening of 150 mm) is provided at a position of about 2 mm from the substrate 21 (copper foil substrate) so that the silicon thin film is formed to a width of 180 mm. Further, oxygen gas is directed toward each opening 31 of the metal mask 25 through a reaction gas nozzle provided on the film-forming side of the substrate 21. Thus, a silicon oxide thin film is formed on the substrate 21. A conveyance system 50C is configured to allow the substrate 21 to be conveyed reciprocatingly. One cycle of conveyance allows one layer of silicon thin film with a film thickness of about 1 μm to be formed on each of both sides of the substrate 21. With reciprocating conveyance, the film formation is repeated 15 times, so that a silicon thin film of about 15 μm is formed.

The formation of the respective layers on both sides of the substrate 21 is performed, for example, with an average emission current of 950 mA, a substrate-conveying speed of 3.6 m/minute, and an average film-forming rate of 200 nm/second. At this time, argon gas as a cooling gas is introduced at 9 sccm into the gap between the cooler body 1 and the substrate 21. Further, oxygen gas as a reaction gas for film formation is introduced at 30 sccm through a reaction gas nozzle toward each opening 31.

A blowing roller 6a is provided on the conveyance channel after a silicon thin film is formed on one surface (first surface) of the substrate 21 before the film formation on the other surface (second surface). The blowing roller 6a is configured so that the external shell 11 has a diameter of 250 mm, a length in the axis direction of 400 mm, and a thickness of 4 mm, the through holes 13 have a diameter of 1 mm and are arranged in five rows with the hole pitch A set to 20 mm and the hole pitch B set to 50 mm, and the distance between the external shell 11 and the internal block 13 in the clearance 15 is 100 μm. Oxygen gas is introduced at 250 sccm as a cooling gas through the gas flow path 16. Further, an aluminum block (gas leakage-reducing member) having an average thickness of 5 mm is provided at a position of 200 μm from the outer circumferential surface of the external shell 11. This configuration allows the substrate 21 to be maintained at almost constant temperature at the times of starting the film formation on the respective surfaces of the substrate 21.

In addition, a blowing roller 6b is provided in the course after the completion of the film formation, in the respective conveyance cycles of the substrate 21, before reaching the spool roller 26. This configuration allows a reduction in the temperature of the substrate 21 when being wound to almost room temperature. By reducing the temperature of the substrate 21 when being wound nearly to room temperature, the occurrence of wrinkles due to thermal deformation of the substrate 21 when being wound can be prevented, and a buckling phenomenon due to the contraction of the substrate 21 after being wound can also be prevented. The blowing roller 6b is configured so that the external shell 11 has a diameter of 200 mm, a length in the axis direction of 400 mm, and a thickness of 3 mm, the through holes 13 have a diameter of 1 mm and are arranged in five rows with the hole pitch A set to 15 mm and the hole pitch B set to 50 mm, and the distance between the external shell 11 and the internal block 12 in the clearance 15 is 60 μm. Oxygen gas is introduced at 120 sccm as a cooling gas through the gas flow path 16.

Although the cases of using argon gas and oxygen gas as a cooling gas to be introduced into the blowing roller 6 are mentioned above, inert gases such as helium gas, neon gas, xenon gas, and krypton gas, or hydrogen gas may also be used as a cooling gas.

(Blowing Roller According to the First to the Third Modifications)

In the thin film production of the take-up type, the radiation heat from the film-forming source 19 can be mentioned as the thermal load received by the substrate 21, in addition to the condensation heat of the film-forming material. Therefore, the thermal load is not necessarily constant in the width direction of the substrate 21. Accordingly, the cooling intensity in the case of cooling the substrate 21 with a gas is desired to be adjustable in the width direction of the substrate 21 depending on the state of thermal load on the substrate 21. Further, it is desired that the gas cooling equipment for use in the thin film production of the take-up type be easy to ensure the processing accuracy and be free from adverse effects resulting from the tension of the substrate 21.

The first to the third modifications described below solve the above-mentioned problems and achieve gas cooling suitable for cooling the substrate 21 with a large width while suppressing the reduction in the degree of vacuum. It should be noted that the features of the embodiment described with reference to FIG. 1 to FIG. 10 can be applied to the blowing rollers of the respective modifications and the thin film production using the blowing rollers as long as no technical contradiction occurs.

The blowing rollers according to the first to the third modifications are briefly described as follows.

In the blowing rollers described with reference to FIG. 4 to FIG. 9, a plurality of manifolds may be formed along the width direction parallel to the rotation axis of the first shell. This configuration allows the gas to be introduced independently via each manifold into the through holes.

A support body for securing the internal block may be provided. The support body has a gas flow path communicating with the plurality of manifolds. Among the plurality of manifolds, the amount of the gas to be introduced into one manifold or a plurality of manifolds formed on the inner side of the manifolds disposed at the end portions can be set larger than the amount of the gas to be introduced into the manifolds disposed at the end portions. This configuration allows the substrate to be cooled more intensively in the center portion than in the end portions.

The gas flow path may include a first gas flow path communicating with all the plurality of manifolds and a second gas flow path communicating with one manifold formed on the inner side of the manifolds disposed at the end portions. In the case where a plurality of manifolds are formed on the inner side of the manifolds disposed at the end portions, the second gas flow path may communicate with at least one selected from the plurality of manifolds formed on the inner side of the manifolds disposed at the end portions. This configuration allows the variation in types of the cooling gas in the width direction of the substrate.

The internal block may have a plurality of divided blocks that are aligned in the width direction of the substrate and that correspond to the plurality of manifolds. The first shell may have a plurality of divided shells (first divided shells) that correspond to the divided blocks. This configuration allows the first shell with a large width to be obtained by easy processing.

Meanwhile, the internal block may have a plurality of divided blocks that are aligned in the width direction of the substrate and that correspond to the plurality of manifolds. The first shell may have a plurality of divided shells that correspond to the divided blocks. The divided shells each may have a mechanism for connecting to the internal block or the support body supporting the internal block via a bearing. This configuration enables the prevention of the contact between the first shell and the internal block.

A second shell having a plurality of through holes for introducing the cooling gas into the through holes of the first shell from the manifolds of the internal block may be provided between the first shell and the internal block. A space may be formed between the first shell and the second shell, and a space may be formed between the second shell and the internal block. The internal block may have a plurality of divided blocks aligned in the width direction of the substrate and divided corresponding to the plurality of manifolds. The second shell may have a plurality of divided shells (second divided shells) that correspond to the divided blocks. This configuration allows the second shell with a large width to be obtained by easy processing.

It is also possible to provide a support body for securing the internal block, a first connection mechanism for connecting the second shell with the internal block or the support body via a bearing, and a second connection mechanism for connecting the first shell with the second shell via a bearing. This configuration allows the second shell to be driven to rotate, thus preventing the first shell from causing abrasion damage to the substrate.

The support body may have a water flow path for allowing water for cooling rollers to flow. This configuration enables the prevention of the temperature increase of the rollers.

Next, the blowing rollers according to the first to the third modifications are described with reference to the drawings. The same components as those described in the embodiment are denoted by the same reference numerals, and the descriptions thereof are omitted. Similarly, the components that are commonly used in the respective modifications are denoted by the same reference numerals, and the descriptions thereof are omitted.

Figure 11:
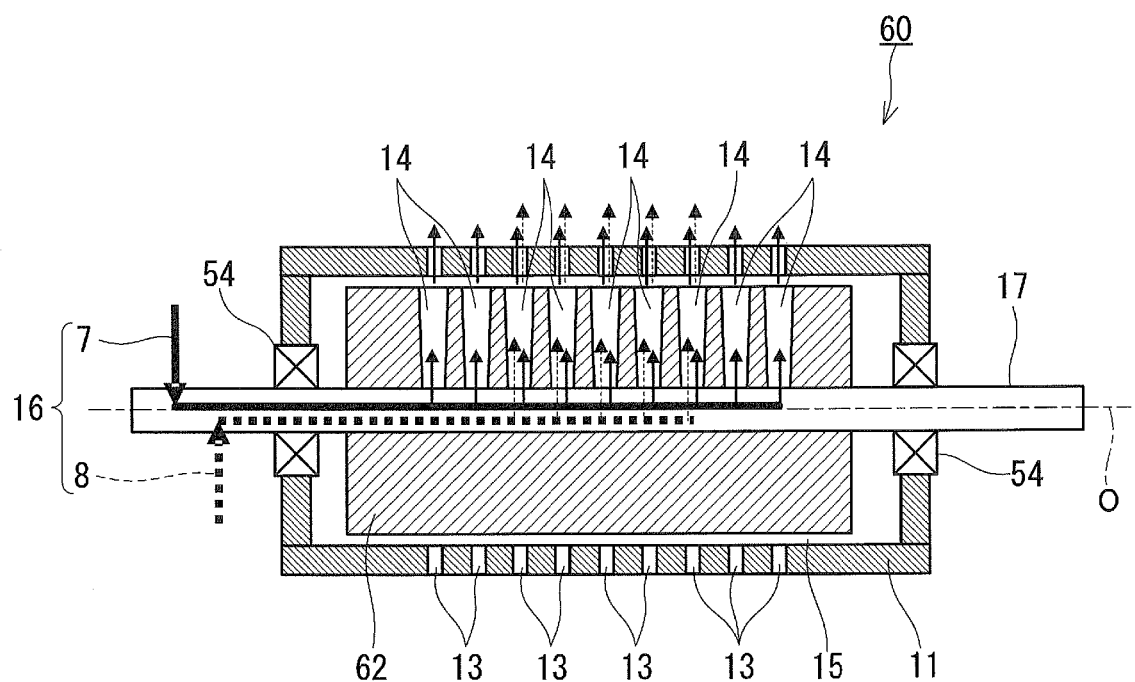
FIG. 11 is a vertical sectional view of a blowing roller according to a first modification.

FIG. 11 is a vertical sectional view of a blowing roller according to the first modification. As shown in FIG. 11, a blowing roller 60 includes the first shell 11, an internal block 62, and the support body 17.

The manifold 14 into which the gas is introduced and the clearance 15 provided outside the range of the manifold 14 are formed between the first shell 11 and the internal block 62. The manifold 14 is a hollow space formed between the first shell 11 and the internal block 62, and a plurality of manifolds 14 are formed by the internal block 62. Specifically, the plurality of manifolds 14 are formed along the width direction parallel to the rotation axis O of the first shell 11. The manifolds 14, for example, are formed by hollowing parts of the internal block 62, and are connected to the through holes 13 of the first shell 11 and the gas flow path 16 (gas introduction port) of the support body 17 supporting the internal block 62. The support body 17 and the internal block 62 may have an integrated structure. The cooling gas introduced through the gas flow path 16 is supplied to the through holes 13 via the manifolds 14. It is possible to introduce the cooling gas into the through holes 13 with high conductance by setting the distance between the external shell 11 and the internal block 62 in the manifolds 14, for example, to 5 mm or more. Further, by forming a plurality of manifolds 14 and changing the shape of each manifold 14, as needed, it is also possible to set the conductance of each gas channel extending from the gas flow path 16 to the through holes 13 independently. This enables the intensity of gas cooling in the width direction of the substrate 21 to be varied.

The plurality of first through holes 13 are provided in a plurality of rows corresponding to the plurality of manifolds 14. Thus, a uniform pressure can be maintained between the first shell 11 and the substrate 21. The support body 17 has the gas flow path 16 for introducing the gas from the outside of the vacuum chamber 22 into the plurality of manifolds 14. The gas flow path 16 communicates with each of the plurality of manifolds 14. This configuration allows the cooling gas to be introduced into each of the manifolds 14 smoothly.

For example, in the thin film formation using a vacuum process, the thermal load to be applied on the center portion in the width direction of the substrate 21 is larger in many cases than the thermal load to be applied on the end portions in the width direction of the substrate 21. This is because the thermal load derived from radiation heat is larger around the center portion of the substrate 21 than in the end portions, even if the thin film has a uniform film thickness. In such a case, the conductance of the plurality of manifolds 14 may be designed so that the ejection of the cooling gas from the respective manifolds 14 of the blowing roller 60 via the through holes 13 of the first shell 11 is relatively increased around the center portion of the substrate 21 and is relatively decreased at the end portions of the substrate 21. In this way, the cooling intensity can be varied depending on the thermal load to be applied on the substrate 21. The temperature distribution in the width direction of the substrate 21 can be reduced, and heat deflection, etc., of the substrate 21 can be suppressed.

Alternatively, a plurality of systems of the gas flow path 16 may be provided as shown in FIG. 11. That is, the gas flow path 16 has a first gas flow path 7 communicating with all the plurality of manifolds 14 and a second gas flow path 8 communicating with the manifolds 14 formed on the inner side of the manifolds 14 disposed at the end portions. Specifically, the second gas flow path 8 communicates with at least one of the plurality of manifolds 14 formed on the inner side of the two manifolds 14 located at both ends in the width direction among the plurality of manifolds 14. This enables the amount of the gas to be introduced into the manifolds 14 to be varied in the width direction of the substrate 21, and the cooling intensity to be varied depending on the thermal load applied on the substrate 21. This also allows the type of gas used in the first gas flow path 7 to differ from the type of gas used in the second gas flow path 8. For example, when the thermal load is large in the center portion of the substrate 21, particularly in the case of using a metal foil substrate, the center portion of the substrate 21 tends to be extended. This tends to cause a slight elevation of the center portion of the substrate 21 from the blowing roller 60. In such a case, argon gas is used in the first gas flow path 7 while helium gas is used in the second gas flow path 8, for example. Helium gas, though being expensive, is less likely to cause the collision of molecules and thus allows cooling performance to be easily obtained even if the distance between the blowing roller 60 and the substrate 21 is large. This enables the vicinity of the center portion of the substrate 21 to be cooled intensively even if the substrate 21 is elevated from the blowing roller 60 to some extent.

In FIG. 11, the second gas flow path 8 communicates with each of the plurality of manifolds 14 formed on the inner side of the two manifolds 14 disposed at both ends. The second gas flow path 8 can communicate with only one manifold 14 in the center portion in the case where only one manifold 14 is formed on the inner side of the two manifolds 14 located at both ends (that is, the number of manifolds 14 is three). In this way, the second gas flow path 8 can communicate only with one manifold 14 formed on the inner side of the two manifolds 14 disposed at both ends. Meanwhile, in the case where a plurality of manifolds 14 are formed in the center portion, the second gas flow path 8 can communicate only with at least one selected from the plurality of manifolds 14 formed in the center portion.

The distance between the first shell 11 and the internal block 62 in the clearance 15 is set smaller than that in the manifold 14. The distance, for example, is 30 µm to 200 µm. When the distance is excessively large, the amount of cooling gas leaking through the through holes 13 via the clearance 15 increases, which reduces the degree of vacuum. When the distance is excessively small, the first shell 11 and the internal block 62 may be brought into contact due to poor processing accuracy, deformation caused by thermal expansion, etc., which increases the risk of abnormal rotation or damage to the blowing roller 60.

The manifolds 14 are provided within the range of the holding angle. This makes it easier to confine the cooling gas released through the through holes 13 via the manifolds 14 into the gap between the first shell 11 and the substrate 21. Further preferably, the manifolds 14 are defined within a range that is shifted from each of both ends of the range of the holding angle toward the inside by at least the hole pitch A. This makes it far easier to confine the cooling gas released through the through holes 13 via the manifolds 14 into the gap between the first shell 11 and the substrate 21.

Figure 12:
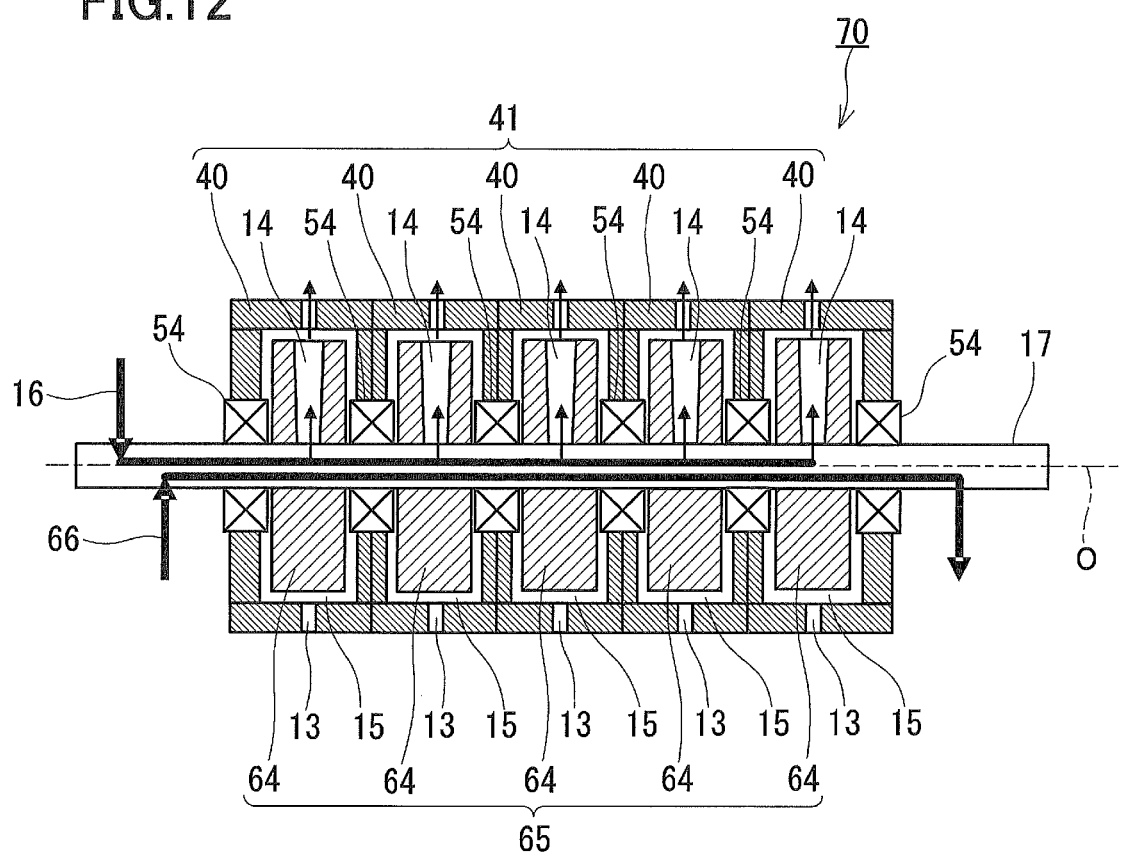
FIG. 12 is a vertical sectional view of a blowing roller according to a second modification.

FIG. 12 is a vertical sectional view of a blowing roller according to the second modification. A blowing roller 70 includes the first shell 41, an internal block 65, the support body 17, and a plurality of bearings 54. The internal block 65 is composed of a plurality of divided blocks 64 that are aligned in the width direction so as to define each of the plurality of manifolds 14. The first shell 41 has a plurality of divided shells 40 that correspond to the plurality of divided blocks 64. Each divided block 64 is secured to the support body 17. The plurality of bearings 54 rotatably connect the first shell 41 (that is, the plurality of divided shells 40) to the support body 17. The support body 17 may be integrally formed with the internal block 65. In this case, the plurality of bearings 54 serve to connect the first shell 41 (the plurality of divided shells 40) respectively to the plurality of divided blocks 64.

The internal block 65 can be composed of the plurality of divided blocks 64 that are aligned in the width direction of the substrate 21 and that correspond to the division of the manifold 14. Further, the first shell 41 can be composed of the plurality of divided shells 40 that correspond to the divided blocks 64. The division of the internal block 65 and the first shell 41 each into a plurality thereof allows the blowing roller 70 to be obtained easily, depending on the desired cooling conditions, by recombining the divided blocks 64 and the divided shells 40. Further, the processing accuracy, particularly in grinding the inner surface, is made easy to maintain even in the blowing roller 70 with a large width.

Furthermore, the plurality of divided shells 40 each are connected to the internal block 65 or the support body 17 supporting the internal block 65 via the bearings 54. This configuration allows the first shell 41 to be firmly supported with short spans, thus enabling the prevention of the contact between the first shell 41 and the internal block 65.

The structure of the blowing roller 70 shown in FIG. 12 allows the through holes 13 of the first shell 41 to move with the rotation of the first shell 41, facing the manifold 14 and the clearance 15. The conductance from the gas flow path 16 to the through holes 13 is far larger via the manifolds 14 than via the clearance 15. Therefore, the amount of cooling gas that passes outwardly through the through holes 13 when facing the manifolds 14 is larger than the amount of cooling gas that passes through the through holes 13 when facing the clearance 15, in the absence of the substrate 21. Accordingly, the cooling gas can be released efficiently through the through holes 13 within the range of the holding angle where the substrate 21 is in contact with the blowing roller 70, and thus the cooling gas pressure between the first shell 41 and the substrate 21 can be kept high.

In the presence of the substrate 21, the cooling gas at high pressure is present between the first shell 41 and the substrate 21 within the range of the holding angle, and therefore the first shell 41 can receive heat efficiently from the substrate 21. On the other hand, outside the range of the holding angle, the first shell 41 is present close to the internal block 65, and the cooling gas is maintained between the first shell 41 and the internal block 65. Therefore, the first shell 41 is efficiently cooled by the internal block 65. In this way, the first shell 41 periodically repeats cooling the substrate 21 and releasing heat into the internal block 65 with the rotation of the first shell 41, and thus can maintain stable cooling operation for a long period of time.

The amount of cooling gas that leaks through the gap between the substrate 21 and the outer circumferential surface of the first shell 41 can be reduced by setting the average pressure of the gap between the substrate 21 and the outer circumferential surface of the first shell 41 lower than the atmospheric pressure at the time of introducing the cooling gas. Thereby, the load on the discharge pumps 35 can be reduced.

Moreover, since a reduced amount of the gas is introduced, the buoyancy caused by the average pressure of the gap between the substrate 21 and the outer circumferential surface of the first shell 41 is smaller than the normal force of the substrate 21 to the blowing roller 70 caused by the conveyance tension of the substrate 21. Therefore, the variation in the distance between the substrate 21 and the outer circumferential surface of the first shell 41 depending on whether or not the gas is introduced, for example, is 100 µm or less. That is, the substrate 21 can be cooled efficiently while the elevation of the substrate 21 is prevented.

The optimal cooling conditions in the width direction of the substrate 21 can be achieved by forming the plurality of manifolds 14 in the width direction of the substrate 21. Accordingly, even if a reduced amount of cooling gas is introduced, the gas pressure between the blowing roller 70 and the substrate 21 can be kept high. Further, a compact cooling function is made feasible, which can suppress an increase in size and cost of equipment.

For example, the blowing roller 70 is configured so that the first shell 41 has a diameter of 110 mm, a width of 120 mm, and a thickness of 6.5 mm, the through holes 13 have a diameter of 1 mm and are arranged in five rows with the hole pitch A set to 20 degrees and the hole pitch B set to 15 mm, and the distance between the first shell 41 and the internal block 65 in the clearance 15 is 100 µm. A gas cooling performance equivalent to that in the case of introducing helium gas into the vacuum chamber 22 without introducing the gas through the gas flow path 16 so that the vacuum chamber 22 is entirely maintained at 100 Pa can be obtained by dividing the manifold 14 of the internal block 65 into five and introducing helium gas, at a total of 20 sccm into the manifolds 14 at both ends, and at a total of 53 sccm into the three manifolds 14 in the center portion, as a cooling gas through the gas flow path 16. The heat transfer coefficient can be calculated by measuring the temperature of the substrate 21 running on the surface of the blowing roller 70 using a thermocouple, etc., from the running time and variation in the temperature of the substrate 21. The heat transfer coefficient resulting from gas cooling, for example, is 0.003 W/cm$^2$/K, though it also depends on the type of the substrate 21. In this case, for example, helium gas needs to be introduced at about 680 sccm just by introducing a structure to create a differential pressure into a part of the vacuum chamber 22. The blowing roller 70 allows a reduction in the necessary gas introduction rate to about 1/9. Further, an increased amount of gas flow in the center portion of the substrate 21 compared to at the end portions can enhance the cooling of the substrate 21 in the center portion, thus suppressing the deformation of the substrate 21 effectively.

The thin film production using the blowing roller 70 is described more specifically. For example, the blowing roller 70 is used instead of the blowing roller 6 of the film-forming apparatus 20B described with reference to FIG. 2.

As the substrate 21, a surface-roughened copper foil (thickness: 18 μm; width: 100 mm), manufactured by Furukawa Circuit Foil Co., Ltd., that serves as a current collector is used, and a silicon multilayer thin film is formed by vacuum evaporation to a thickness of 8 μm on each of both sides of the current collector. The air inside the vacuum chamber 22, provided with two 14 inch-bore oil diffusion pumps that serve as the discharge pumps 35, having a volume of 0.4 m$^3$ is displaced to 0.002 Pa, and thereafter silicon as a film-forming material is melted. Silicon is melted using an electron beam evaporation source with 270-degree deflection (film-forming source 19) manufactured by JEOL Ltd. The molten silicon is irradiated with an electron beam generated by an acceleration voltage of −10 kV and an emission current of 520 to 700 mA, and then the generated vapor is directed toward the substrate 21 running along the can 27.

A metal mask (having an opening length of 100 mm) is provided at a position of about 2 mm from the substrate 21 so that the silicon thin film is formed to a width of 85 mm. The conveyance system 50B is configured to allow the substrate 21 to be conveyed reciprocatingly. One cycle of conveyance allows one layer of silicon thin film with a film thickness of about 0.5 μm to be formed on each of both sides of the substrate 21. With reciprocating conveyance, the film formation is repeated 16 times, so that a silicon thin film of about 8 μm is formed.

The formation of the respective layers on both sides of the substrate 21 is performed, for example, with an average emission current of 600 mA, a substrate-conveying speed of 2 m/minute, and an average film-forming rate of 80 nm/second.

The blowing roller 70 (which corresponds to the blowing roller 6a of FIG. 2) is provided on the conveyance channel after a silicon thin film is formed on one surface (first surface) of the substrate 21 before the film formation on the other surface (second surface). The blowing roller 70 is configured so that the first shell 41 has a diameter of 120 mm, a length in the axis direction of 120 mm, and a thickness of 4 mm, the through holes 13 have a diameter of 1 mm and are arranged in five rows with the hole pitch A set to 20 degrees and the hole pitch B set to 15 mm, and the distance between the first shell 41 and the internal block 65 in the clearance 15 is 80 μm. Argon gas is introduced into the two manifolds 14 at both ends at a total of 20 sccm, and into the three manifolds 14 in the center portion at a total of 60 sccm, as a cooling gas through the gas flow path 16. This configuration allows the substrate 21 to be maintained at almost constant temperature at the times of starting the film formation on the respective surfaces of the substrate 21. By achieving uniform temperature on both sides of the substrate 21 at the times of starting the film formation, the warpage of the substrate 21 after the film formation resulting from the difference in the thermal expansion coefficient, etc., can be reduced as well as the qualities of thin films can be made consistent. Further, the maximum temperature of the substrate 21 can be lowered by suppressing the temperature of the substrate 21 at the time of starting the film formation on the second surface to a low level, and thus deterioration of the substrate 21 can be prevented.

In addition, another blowing roller 70 (which corresponds to the blowing roller 6b in FIG. 2) is provided in the course after the completion of the film formation, in the respective conveyance cycles of the substrate 21, before reaching the spool roller 26. This configuration allows a reduction in the temperature of the substrate 21 when being wound to almost room temperature. By reducing the temperature of the substrate 21 when being wound nearly to room temperature, the occurrence of wrinkles due to thermal deformation of the substrate 21 when being wound can be prevented, and a buckling phenomenon due to the contraction of the substrate 21 after being wound can also be prevented. The blowing roller 70 is configured so that the first shell 41 has a diameter of 80 mm, a length in the axis direction of 120 mm, and a thickness of 3 mm, the through holes 13 have a diameter of 1 mm and are arranged in five rows with the hole pitch A set to 15 degrees and the hole pitch B set to 15 mm, and the distance between the first shell 41 and the internal block 65 in the clearance 15 is 50 μm. Argon gas is introduced into the two manifolds at both ends at a total of 14 sccm, and into the three manifolds 14 in the center portion at a total of 36 sccm, as a cooling gas through the gas flow path 16.

Figure 13:
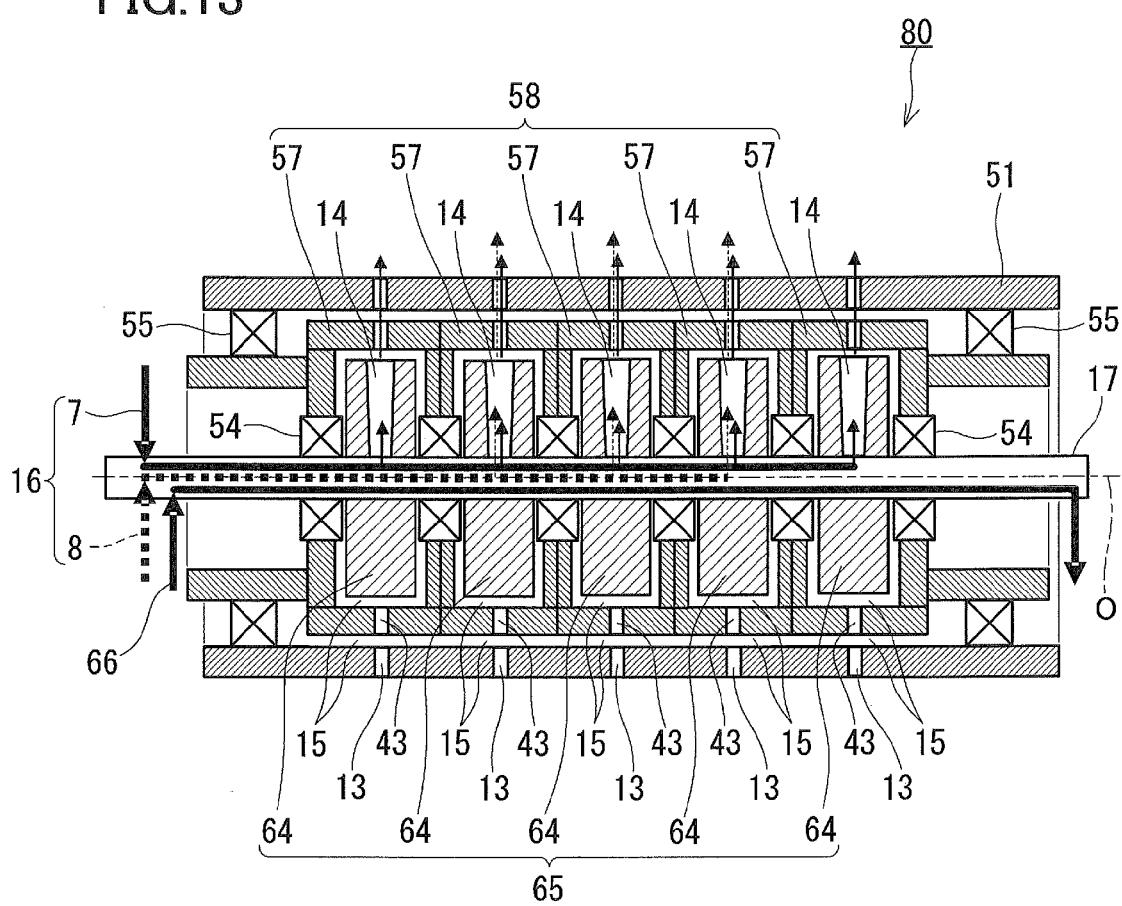
FIG. 13 is a vertical sectional view of a blowing roller according to a third modification.

Next, FIG. 13 is a vertical sectional view of a blowing roller according to the third modification. A blowing roller 80 includes a first shell 51, a second shell 58, the internal block 65, the support body 17, first bearings 54, and second bearings 55. The first shell 51 has a generally the same structure as the aforementioned first shell 11. The second shell 58 has a generally the same structure as the first shell 41 described with reference to FIG. 12. In this modification, the second shell 58 is disposed between the first shell 51 and the internal block 65. The second shell 58 has a cylindrical shape. The rotation axis of the second shell 58 may coincide with the rotation axis O of the first shell 51, or may be shifted therefrom. The second shell 58 has a smaller outer diameter than the inner diameter of the first shell 51. The second shell 58 has a plurality of second through holes 43 for introducing the gas from the plurality of manifolds 14 into the plurality of first through holes 13 of the first shell 51. The internal block 65 is composed of the plurality of divided blocks 64 that are aligned in the width direction so as to define each of the plurality of manifolds 14. The second shell 58 has a plurality of divided shells 57 (second divided shells) that correspond to the plurality of divided blocks 64. A part of the clearance 15 is formed between the internal block 65 and the second shell 58, and the other a part of the clearance 15 is formed between the second shell 58 and the first shell 51. In this way, the blowing roller 80 has a structure in which the blowing roller 70 described with reference to FIG. 12 is further covered by another shell.

The internal block 65 is secured to the support body 17. The support body 17 has the gas flow path 16 for introducing the gas from the outside of the vacuum chamber 22 into the manifolds 14, and a refrigerant flow path 66 for allowing a refrigerant for cooling the support body 17 to flow. The gas flow path 16 may have the first gas flow path 7 and the second gas flow path 8, or may be composed of a single flow path capable of supplying only one type of gas to the manifolds 14. The first bearings 54 rotatably connect the second shell 58 to the support body 17. The second bearings 55 rotatably connect the first shell 51 to the second shell 58.

As shown in FIG. 13, the second shell 58 can be disposed between the first shell 51 and the internal block 65. A space is formed between the first shell 51 and the second shell 58 and a space is formed between the second shell 58 and the internal block 65. The second through holes 43 for introducing the cooling gas from the manifolds 14 into the through holes 13 of the first shell 51 may be formed in the second shell 58. The second shell 58 composed of a plurality of divided shells 57 (second divided shells) corresponding to the divided blocks 64 that form the internal block 65 facilitates maintaining the processing accuracy, particularly in grinding the inner surface, even in the blowing roller 80 with a large width. Further, the second shell 58 can be rotatably connected to the internal block 65 or the support body 17 securing the internal block 65 via the bearings 54. Furthermore, the first shell 51 and the second shell 58 can be rotatably connected via the bearings 55. This configuration allows the second shell 58 to be driven to rotate, thus preventing the first shell 51 from causing abrasion damage to the substrate 21.

Since the blowing roller 80 cools the substrate 21, a water flow path 66 (refrigerant flow path) for cooling water is desirably provided in the support body 17 in order to prevent the temperature increase. The cooling means is not limited to water, and various refrigerants in the form of a liquid or gas can be used. Water is supplied from the outside of the vacuum chamber 22 to the water flow path 66. The water that has flowed through the water flow path 66 is returned to the outside of the vacuum chamber 22.

The through holes 13 of the first shell 51 move with the rotation of the first shell 51, facing the manifolds 14 and the clearance 15 via the second shell 58. That is, the first shell 51 is cooled by the internal block 65 via the second shell 58.

The thin film production using the blowing roller 80 is described more specifically. For example, the blowing roller 80 is used instead of the blowing roller 6 of the film-forming apparatus 20C described with reference to FIG. 3.

As the substrate 21, a surface-roughened copper foil (thickness: 18 μm; width: 200 mm), manufactured by Furukawa Circuit Foil Co., Ltd., that serves as a current collector is used, and a silicon oxide multilayer thin film is formed by vacuum evaporation to a thickness of 15 μm on each of both sides of the current collector. The air inside the vacuum chamber 22, provided with two 14 inch-bore oil diffusion pumps that serve as the discharge pumps 35, having a volume of 0.4 m³ is displaced to 0.002 Pa, and thereafter silicon as a film-forming material is melted. Silicon is melted using an electron beam evaporation source with 270-degree deflection (film-forming source 19) manufactured by JEOL Ltd. The molten silicon is irradiated with an electron beam generated by an acceleration voltage of −10 kV and an emission current of 950 mA, and then the generated vapor is directed toward the substrate 21.

The substrate 21 moves at a position of about 0.5 mm from the cooler body 1 cooled by cooling water at 10° C. While the substrate 21 is moving along the cooler body 1, a silicon thin film is formed thereon. The length of the cooler body 1 in the width direction of the substrate 21 is 90 mm. The structure of the cooler body 1 is as mentioned above with reference to FIG. 10.

The metal mask 25 (having a length of each opening of 150 mm) is provided at a position of about 2 mm from the substrate 21 so that the silicon thin film is formed to a width of 180 mm. Further, oxygen gas is directed toward each opening 31 of the metal mask 25 through a reaction gas nozzle provided on the film-forming side of the substrate 21. Thus, a silicon oxide thin film is formed on the substrate 21. One cycle of conveyance allows one layer of silicon thin film with a film thickness of about 1 μm to be formed on each of both sides of the substrate 21. With reciprocating conveyance, the film formation is repeated 15 times, so that a silicon thin film of about 15 μm is formed.

The formation of the respective layers on both sides of the substrate 21 is performed, for example, with an average emission current of 950 mA, a substrate-conveying speed of 3.6 m/minute, and an average film-forming rate of 200 nm/second. At this time, argon gas as a cooling gas is introduced at 9 sccm into the gap between the cooler body 1 and the substrate 21. Further, oxygen gas as a reaction gas for film formation is introduced at 30 sccm through a reaction gas nozzle toward each opening 31.

The blowing roller 80 (which corresponds to the blowing roller 6a of FIG. 3) is provided on the conveyance channel after a silicon thin film is formed on one surface (first surface) of the substrate 21 before the film formation on the other surface (second surface). The blowing roller 80 is configured so that the first shell 51 has a diameter of 250 mm, a length in the axis direction of 400 mm, and a thickness of 4 mm, the through holes 13 have a diameter of 1 mm and are arranged in nine rows with the hole pitch A set to 20 degrees and the hole pitch B set to 25 mm, the distance between the first shell 51 and the second shell 58 is 100 μm, and the distance between the second shell 58 and the internal block 65 in the clearance 15 is 100 μm. The manifold 14 of the internal block 65 is divided into nine. Then, oxygen gas is introduced almost uniformly into all the manifolds 14 at a total of 200 sccm, and helium gas is introduced into the five manifolds 14 in the center portion at a total of 50 sccm, as a cooling gas through the gas flow path 16. Further, an aluminum block (gas leakage-reducing member) having an average thickness of 5 mm is provided at a position of 200 μm from the outer circumferential surface of the first shell 51. This configuration allows the substrate 21 to be maintained at almost constant temperature at the times of starting the film formation on the respective surfaces of the substrate 21.

In addition, another blowing roller 80 (which corresponds to the blowing roller 6b in FIG. 3) is provided in the course after the completion of the film formation, in the respective conveyance cycles of the substrate 21, before reaching the spool roller 26. This configuration allows a reduction in the temperature of the substrate 21 when being wound to almost room temperature. By reducing the temperature of the substrate 21 when being wound nearly to room temperature, the occurrence of wrinkles due to thermal deformation of the substrate 21 when being wound can be prevented, and a buckling phenomenon due to the contraction of the substrate 21 after being wound can be prevented. The blowing roller 80 is configured so that the first shell 51 has a diameter of 200 mm, a length in the axis direction of 400 mm, and a thickness of 3 mm, the through holes 13 have a diameter of 1 mm and are arranged in nine rows with the hole pitch A set to 15 degrees and the hole pitch B set to 25 mm, the distance between the first shell 51 and the second shell 58 is 100 μm, and the distance between the second shell 58 and the internal block 65 in the clearance 15 is 60 μm. The manifold 14 of the internal block 65 is divided into nine. Then, oxygen gas is introduced almost uniformly into all the manifolds 14 at a total of 100 sccm, and helium gas is introduced into the five manifolds 14 in the center portion at a total of 40 sccm, as a cooling gas through the gas flow path 16. A timing pulley, which is not shown, is provided in the second shell 58 of the blowing roller 80. The timing pulley is driven by a timing belt and a motor. The angular speed of the second shell 58, for example, is equal to the angular speed of a roller having the same diameter as the first shell 51 when the roller rotates at the same speed as the conveyance speed of the substrate 21.

In the blowing roller 70 (or 80) described above, the plurality of manifolds 14 are formed in the width direction of the substrate 21. Therefore, the cooling intensity can be adjusted in the width direction of the substrate 21 by the amount of gas to be introduced or the type of gas. The blowing roller 80 is easy to ensure the processing accuracy because it is composed of the internal block 65, the first shell 51, and the second shell 58. Further, since the first shell 51 and the second shell 58 each are supported by a bearing mechanism, the variation in the dimension in the radial direction of the clearance 15 due to the tension of the substrate 21 can be reduced. Therefore, even if the substrate 21 with a large width is used and a reduced amount of cooling gas is introduced, the gas pressure between the first shell 41 (or 51) and the substrate 21 can be kept high. Further, the second shell 58 is provided and driven, thus preventing the first shell 51 from causing abrasion damage to the substrate 21. Accordingly, a compact roller for gas cooling capable of gas cooling while suppressing the reduction in the degree of vacuum can be achieved. That is, a compact film-forming apparatus capable of cooling the substrate 21 efficiently while suppressing the reduction in the degree of vacuum during the use of the roller for gas cooling can be achieved.

(Blowing Roller According to the Fourth Modification)

When the conveyance speed of the substrate is increased so as to enhance the productivity in the thin film production of the take-up type, abrasion damage may sometimes occur on the substrate in the cases where there is a difference in speed between the substrate and the conveying rollers, and where the surfaces of the rollers are not flat and smooth. Accordingly, it is desired that the substrate can be cooled without mechanical damage to the substrate in the case where the substrate is cooled by gas cooling. It is also desired that the gas cooling equipment for use in the thin film production of the take-up type be easy to ensure the processing accuracy.

The fourth modification described below solves the above-mentioned problems and achieve gas cooling suitable for cooling the substrate with a large width while suppressing the reduction in the degree of vacuum and the damage to the substrate.

The blowing roller according to the fourth modification is briefly described as follows.

In the blowing rollers described with reference to FIG. 4 to FIG. 9, a cylindrical second shell that is disposed between the first shell and the internal block and that has a plurality of second through holes for introducing the gas from the manifold into the plurality of first through holes of the first shell may be further provided. This configuration allows the internal block and the first shell to form a structure for introducing the gas concentrically to the contact portion between the substrate and the first shell. The second shell and the first shell can form a structure for introducing the gas into the gap between the first shell and the substrate without damaging the substrate.

Further, a support body for securing the internal block, a first connection mechanism for connecting the second shell and the support body via bearings, and a second connection mechanism for connecting the first shell and the second shell via bearings may be provided. This configuration allows the second shell to be driven, thus preventing the first shell from causing abrasion damage to the substrate.

The support body may have a gas flow path communicating with the manifold. The gas can be supplied to the manifold via the gas flow path. This configuration allows the gas to be smoothly fed to the channel extending from the manifold to the through holes of the first shell.

Further, the internal block may have a plurality of divided blocks aligned in the width direction of the substrate, and the second shell may have divided shells aligned corresponding to the divided blocks. This configuration allows the second shell with a large width to be obtained by easy processing.

In a preferred aspect, the through holes of the second shell move with the rotation of the second shell, facing the manifold and the clearance. In the absence of the substrate, the amount of gas that passes outwardly through the through holes of the second shell when facing the manifold is larger than the amount of gas that passes through the through holes of the second shell when facing the clearance. In the absence of the substrate, the amount of gas that passes through the through holes of the first shell fluctuates with the rotation of the first shell between when in the range of the holding angle and when outside the range of the holding angle. In the presence of the substrate, the first shell receives heat from the substrate and releases heat into the second shell with the rotation. In the presence of the substrate, the second shell periodically repeats receiving heat from the first shell and releasing heat into the internal block with the rotation. When the gas is introduced, the average pressure of the gap between the substrate and the outer circumferential surface of the first shell is lower than the atmospheric pressure. This configuration allows efficient use of the cooling gas in gas cooling.

Further, the variation in the distance between the substrate and the outer circumferential surface of the first shell depending on whether or not the gas is introduced may be 100 µm or less. This configuration allows efficient cooling of the substrate.

In a preferred aspect, the buoyancy caused by the average pressure of the gap between the substrate and the outer circumferential surface of the first shell is smaller than the normal force of the substrate to the first shell caused by the conveyance tension of the substrate. This configuration can prevent the elevation of the substrate and allows efficient cooling of the substrate.

The second shell may be rotatable independently of the first shell. This configuration can reduce the abrasion damage to the substrate to be caused by the first shell when the second shell is driven.

The through holes of the first shell may be configured to face the through holes of the second shell with the rotation of the first shell. This configuration allows the cooling gas to be efficiently maintained between the first shell and the substrate.

The through holes may be arranged uniformly in the circumferential direction of the first shell, and each row of through holes may be in a phase-shifted relationship to its adjacent row of through holes. This configuration can reduce the fluctuation in cooling intensity The through holes may be arranged uniformly in the circumferential direction of the second shell, and each row of through holes may be in a phase-shifted relationship to its adjacent row of through holes. This configuration can reduce the fluctuation in cooling intensity.

Next, the blowing roller according to the fourth modification is described with reference to the drawings. The same components as those described in the embodiment and the aforementioned modifications are denoted by the same reference numerals, and the descriptions thereof are omitted.

Figure 14:
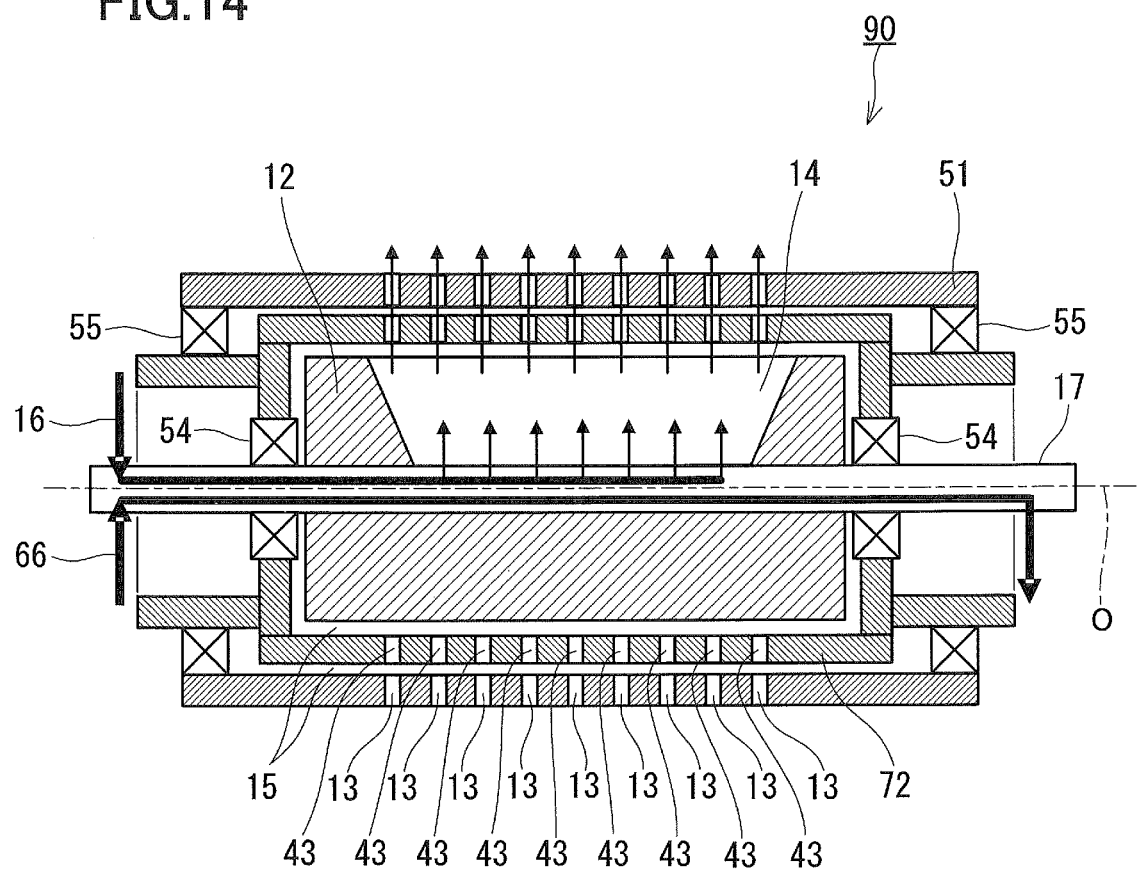
FIG. 14 is a vertical sectional view of a blowing roller according to a fourth modification.

FIG. 14 is a vertical sectional view of a blowing roller according to the fourth modification. As shown in FIG. 14, a blowing roller 90 includes the first shell 51, a second shell 72, the internal block 12, the support body 17, the first bearings 54, and the second bearings 55. That is, the blowing roller 90 has a common structure (double shell structure) with the blowing roller 80 of the third modification. Accordingly, the description on the blowing roller 80 can be incorporated in the description on the blowing roller 90. Likewise, the description on the blowing roller 90 can be incorporated in the description on the blowing roller 80. However, the blowing roller 90 does not possess such a divisional structure in the width direction as the blowing roller 80, and thus is comparatively simple.

The internal block 12 is secured to the support body 17. The support body 17 has the gas flow path 16 for introducing the gas from the outside of the vacuum chamber 22 into the manifold 14. The first bearings 54 rotatably connect the second shell 72 to the support body 17. The second bearings 55 rotatably connect the first shell 51 to the second shell 72. The first shell 51 and the second shell 72 are rotatable independently of each other. The rotation axis O of the first shell 51 coincides with the rotation axis O of the second shell 72. However, the first shell 51 and the second shell 72 are not necessarily coaxial.

The second shell 72 has a cylindrical outer circumferential surface. A plurality of second through holes 43 are formed in the second shell 72. The plurality of second through holes 43 constitute (i) a first group provided along the circumferential direction at a specific position in the width direction parallel to the rotation axis O of the second shell 72, and (ii) a second group provided along the circumferential direction at a position adjacent to the specific position in the width direction. A plurality of second through holes 43 belonging to the first group and a plurality of second through holes 43 belonging to the second group may form a staggered arrangement. This is as has been described with reference to FIG. 8 above.

The blowing roller 90 is described further in detail.

The blowing roller 90 has the first shell 51 that rotates in synchronization with the substrate 21 and the internal block 12 whose rotation in synchronization with the substrate 21 is inhibited. A plurality of through holes 13 (first through holes) are formed in the first shell 51. The second shell 72 is disposed between the first shell 51 and the internal block 12. A space is formed between the first shell 51 and the second shell 72 and a space is formed between the second shell 72 and the internal block 12. A plurality of through holes 43 (second through holes) are formed in the second shell 72. The second shell 72 is disposed in the hollow portion of the first shell 51 in the form of a hollow cylinder. The second shell 72 is in the form of a hollow cylinder, in the hollow portion of which the internal block 12 is disposed. The diameter of the first shell 51, for example, is 40 to 1000 mm. Although it is easier to achieve cooling performance when the first shell 51 has a larger diameter, the first shell 51 with excessively large diameter occupies a larger volume in the vacuum chamber 22, which may result in an increase in the size of the film-forming apparatus 20A, leading to an increase in the cost of equipment. Further, as the diameter increases, the absolute value of deformation due to thermal expansion increases and thus it becomes difficult to maintain the accuracy of the clearance between the first shell 51 and the second shell 72 when the length in the axis direction of the first shell 51 is large. On the other hand, as the diameter of the first shell 51 decreases, it becomes difficult to ensure the processing accuracy in grinding the inner circumferential surface of the first shell 51. The length in the axis direction of the first shell 51 is set larger than the width of the substrate 21 for stable running. The width of the first shell 51, for example, is 100 to 800 mm. The thickness of the first shell 51 in the region formed with the through holes 13, for example, is 2 to 15 mm. When the thickness is small, the deformation of the first shell 51 tends to occur due to the tension applied to the substrate 21. When the first shell 51 is thick, processing to form the through holes 13 is rendered difficult.

The arrangement, size, etc., of the through holes 13 in the first shell 51 are as have been described with reference to FIG. 4.

The diameter of the second shell 72, for example, is 35 to 990 mm. Although it is easier to achieve cooling performance when the second shell 72 has a larger diameter, the second shell 72 with excessively large diameter occupies a larger volume in the vacuum chamber 22, which results in an increase in the size of the film-forming apparatus 20A, leading to an increase in the cost of equipment. Further, as the diameter increases, the absolute value of deformation due to thermal expansion increases and thus it becomes difficult to maintain the accuracy of the clearance between the second shell 72 and the internal block 12 when the length in the axis direction of the second shell 72 is large. On the other hand, as the diameter of the second shell 72 decreases, it becomes difficult to ensure the processing accuracy in grinding the inner circumferential surface of the second shell 72. The length in the axis direction of the second shell 72, for example, is 100 to 800 mm, depending on the width of the substrate 21. The thickness of the second shell 72 in the region formed with the through holes 43, for example, is 2 to 15 mm. When the thickness is small, the deformation of the second shell 72 tends to occur. When the second shell 72 is thick, processing to form the through holes 43 is rendered difficult.

In the same manner as the through holes 13 of the first shell 51, the through holes 43 of the second shell 72 have a diameter, a hole pitch C (which corresponds to the hole pitch A of FIG. 4) in the rotation direction, and a hole pitch D (which corresponds to the hole pitch B of FIG. 4) in the axis direction that are appropriately set, depending on the vacuum conditions or cooling conditions of the substrate 21. The diameter of the through holes 43, for example, is 1 to 10 mm. When the through holes 43 have an excessively large diameter, the leakage of cooling gas increases. Conversely, when the through holes 43 have a small diameter, processing to form the through holes 43 is rendered difficult. The hole pitch C, for example, is 10 to 50 mm. The hole pitch C may also be, for example, about 5 to 30 degrees in terms of the angular pitch in the rotation direction. When the hole pitch C is small, the number of holes to be processed increases, resulting in an increase in the cost of equipment. When the hole pitch C is excessively large, the fluctuation in pressure depending on the rotational position of the second shell 72 increases, and thus the uniformity of the cooling performance decreases. The hole pitch D, for example, is 10 to 200 mm. The hole pitch D is not necessarily a uniform pitch in the axis direction (width direction) of the second shell 72, and can be appropriately adjusted depending on the temperature and cooling state of the substrate 21. When the hole pitch D is small, the number of holes to be processed increases, resulting in an increase in the cost of equipment. However, when the hole pitch D is excessively large, the uniformity of the cooling performance in the width direction decreases.

The hole pitch B of the through holes 13 of the first shell 51 and the hole pitch D of the through holes 43 of the second shell 72 are not necessarily the same. However, when the hole pitch B and the hole pitch D is the same, the following benefits are obtained. That is, when the first shell 51 and the second shell 72 are relatively rotated, the through holes 13 of the first shell 51 overlap the through holes 43 of the second shell 72 in the radial direction of the first shell 51. In this case, it is easy to allow the gas to flow efficiently from the manifold 14 of the internal block 12 to the through holes 13 of the first shell 51 via the through holes 43 of the second shell 72. This configuration allows the substrate 21 to be cooled with a further reduced amount of cooling gas.

The manifold 14 into which the gas is introduced and the clearance 15 provided outside the range of the manifold 14 are formed between the second shell 72 and the internal block 12. The clearance 15 is also formed between the second shell 72 and the first shell 51. The manifold 14 is a hollow space formed between the second shell 72 and the internal block 12. A plurality of manifolds 14 may be formed by the internal block 12. The manifold 14, for example, is formed by hollowing a part of the internal block 12, and is connected to the through holes 43 of the second shell 72, the through holes 13 of the first shell 51, and the gas flow path 16 (gas introduction port) of the support body 17 supporting the internal block 12. The support body 17 and the internal block 12 may have an integrated structure. The cooling gas introduced through the gas flow path 16 of the support body 17 is supplied to the through holes 13 via the manifold 14 and the through holes 43. It is possible to introduce the cooling gas into the through holes 43 with high conductance by setting the distance between the second shell 72 and the internal block 12 in the manifold 14, for example, to 5 mm or more. Further, by forming a plurality of manifolds 14 and changing the shape of each manifold 14, as needed, it is also possible to set the conductance of each gas channel extending from the gas flow path 16 through the manifold 14, the through holes 43 of the second shell 72, to the through holes 13 of the first shell 51 independently. This enables the intensity of gas cooling in the width direction of the substrate 21 to be varied.

For example, in the thin film formation using a vacuum process, the thermal load to be applied on the center portion in the width direction of the substrate 21 is larger in many cases than the thermal load to be applied on the end portions in the width direction of the substrate 21. This is because the thermal load derived from radiation heat is larger around the center portion of the substrate 21 than in the end portions, even if the thin film has a uniform film thickness. In such a case, the conductance of the plurality of manifolds 14 may be designed so that the ejection of the cooling gas from each manifold 14 of the blowing roller 90 via the through holes 43 and the through holes 13 is relatively increased around the center portion of the substrate 21 and is relatively decreased in the end portions of the substrate 21. In this way, the cooling intensity can be varied depending on the thermal load received by the substrate 21. The temperature distribution in the width direction of the substrate 21 can be reduced, and heat deflection, etc., of the substrate 21 can be suppressed.

In the case where the blowing roller 90 has a plurality of manifolds 14, the gas flow path 16 may be composed of a plurality of flow paths, as has been described with reference to FIG. 11.

The distance between the second shell 72 and the internal block 12 in the clearance 15 is set smaller than that in the manifold 14. The distance, for example, is 30 µm to 200 µm. When the distance is excessively large, the amount of cooling gas leaking through the through holes 13 via the clearance 15 increases, which reduces the degree of vacuum. When the distance is excessively small, the second shell 72 and the internal block 12 may be brought into contact due to poor processing accuracy, deformation caused by thermal expansion, etc., which increases the risk of abnormal rotation or damage to the blowing roller 90.

The distance between the first shell 51 and the second shell 72 in the clearance 15, for example, is 30 µm to 200 µm. The rotation axis O of the first shell 51 and the rotation axis of the second shell 72 are not necessarily coincident. For example, the distance between the first shell 51 and the second shell 72 within the range of the holding angle can be set slightly larger than the distance between the first shell 51 and the second shell 72 outside the range of the holding angle. When the distance is excessively large, the amount of cooling gas leaking through the through holes 13 outside the range of the holding angle increases, which reduces the degree of vacuum. When the distance is excessively small, the first shell 51 and the second shell 72 may be brought into contact with each other due to poor processing accuracy, deformation caused by thermal expansion, etc., which increases the risk of abnormal rotation or damage to the blowing roller 80.

The manifold 14 is provided within the range of the holding angle. This makes it easier to confine the cooling gas released through the through holes 13 via the manifold 14 into the gap between the first shell 51 and the substrate 21. Further preferably, the manifold 14 is defined within a range that is shifted from each of both ends of the range of the holding angle toward the inside by at least the hole pitch A. This makes it far easier to confine the cooling gas released through the through holes 13 via the manifold 14 into the gap between the first shell 51 and the substrate 21.

Figure 15:
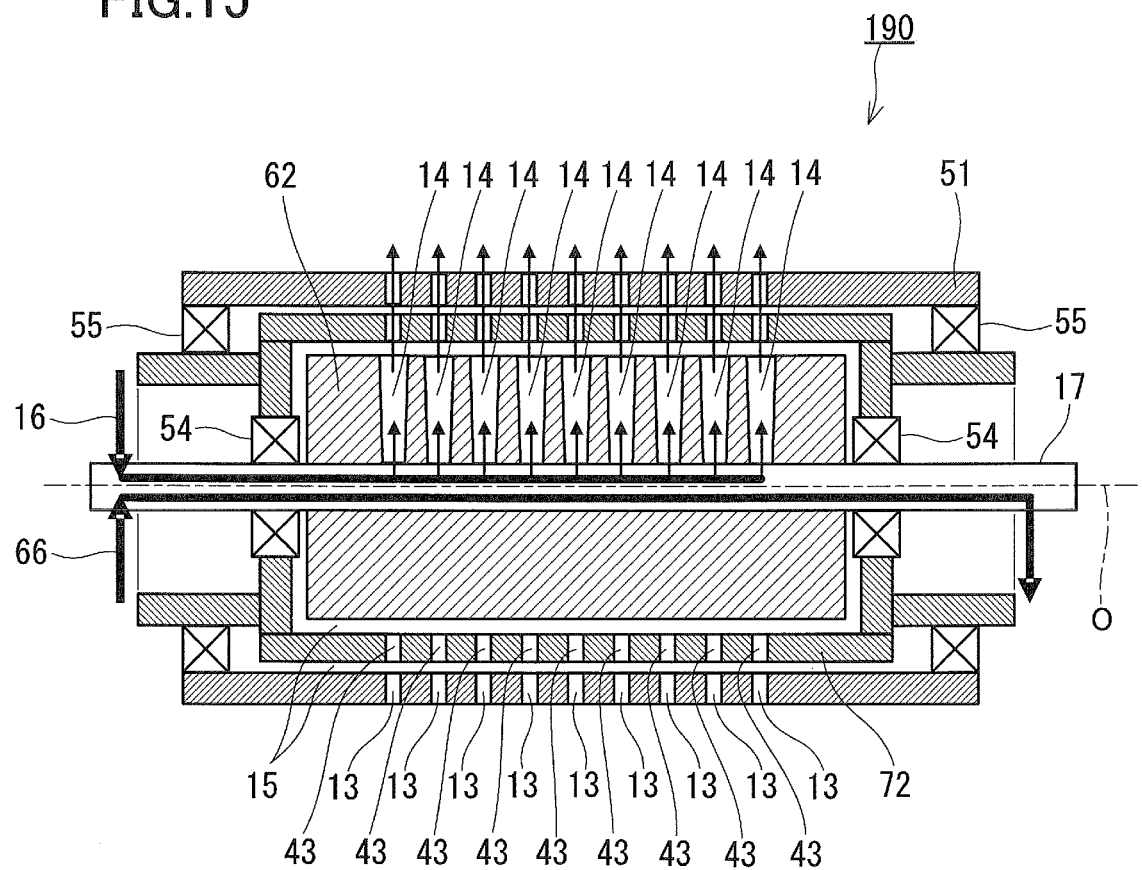
FIG. 15 is a vertical sectional view of a blowing roller according to a fifth modification.

A blowing roller 190 shown in FIG. 15 is obtained by dividing the internal block 12 of the blowing roller 90 in the axis direction. The divisional structure of the internal block is as has been described in detail in the first modification and the second modification.

The first shell 51 and the second shell 72 are rotatably connected via the bearings 55. This configuration allows the second shell 72 to be driven to rotate, thus preventing the first shell 51 from causing abrasion damage to the substrate 21.

As is in the blowing roller 80, the water flow path 66 (refrigerant flow path) may be provided in the support body 17 of the blowing roller 90.

The above-mentioned structure of the blowing roller 90 allows the through holes 13 of the first shell 51 to move with the rotation of the first shell 51, facing the manifold 14 and the clearance 15 via the second shell 72. The conductance from the gas flow path 16 to the through holes 13 via the manifold 14 is far larger than that via the clearance 15. Therefore, the amount of cooling gas that passes outwardly through the through holes 13 when facing the manifold 14 is larger than the amount of cooling gas that passes through the through holes 13 when facing the clearance 15, in the absence of the substrate 21. Accordingly, the cooling gas can be released efficiently through the through holes 13 within the range of the holding angle, and thus the cooling gas pressure between the first shell 51 and the substrate 21 can be kept high.

In the presence of the substrate 21, the cooling gas at high pressure is present between the first shell 51 and the substrate 21 within the range of the holding angle, and therefore the first shell 51 can receive heat efficiently from the substrate 21. On the other hand, outside the range of the holding angle, the first shell 51 is present close to the internal block 12 via the second shell 72, and the cooling gas is maintained between the first shell 51 and the internal block 72. Therefore, the first shell 51 is cooled efficiently by the internal block 12 via the second shell 72. In this way, the first shell 51 periodically repeats cooling the substrate 21 and releasing heat into the internal block 12 with the rotation of the first shell 51, and thus can maintain stable cooling operation for a long period of time.

When the cooling gas is introduced, the average pressure of the gap between the substrate and the outer circumferential surface of the first shell 51 is preferably lower than the atmospheric pressure. Since the amount of cooling gas that leaks through the gap between the substrate 21 and the outer circumferential surface of the first shell 51 can be reduced, the load on the discharge pumps 35 can be reduced. Moreover, since a reduced amount of gas is introduced, the buoyancy caused by the average pressure of the gap between the substrate 21 and the outer circumferential surface of the first shell 51 is smaller than the normal force of the substrate 21 to the blowing roller 90 caused by the conveyance tension of the substrate 21. Therefore, the variation in the distance between the substrate 21 and the outer circumferential surface of the first shell 51 depending on whether or not the gas is introduced is generally 100 µm or less. The substrate 21 can be cooled efficiently while the elevation of the substrate 21 is prevented. The configuration of this modification in which the second shell 72 is disposed between the first shell 51 and the internal block 12 allows both the prevention of abrasion damage to the substrate 21 and the control of the gas blowing direction that enables a high gas pressure to be maintained between the blowing roller 90 and the substrate 21 even if a reduced amount of cooling gas is introduced. Further, a compact cooling function is made feasible, which can suppress an increase in size and cost of equipment.

The blowing roller 90 can be used preferably instead of the blowing roller 6 of the film-forming apparatus 20A shown in FIG. 1.

For example, the blowing roller 90 is configured so that the first shell 51 has a diameter of 110 mm, a width of 120 mm, and a thickness of 6.5 mm, the through holes 13 have a diameter of 1 mm and are arranged in five rows with the hole pitch A set to 20 degrees and the hole pitch B set to 19 mm, the second shell 72 has a thickness of 6 mm, the through holes 43 have a diameter of 3 mm and are arranged in five rows with the hole pitch C set to 15 degrees and the hole pitch D set to 19 mm, the distance between the first shell 51 and the second shell 72 in the clearance 15 is set to 120 µm, and the distance between the second shell 72 and the internal block 12 is set to 100 µm. A gas cooling performance equivalent to that in the case of introducing helium gas into the vacuum chamber 22 without introducing the gas through the gas flow path 16 so that the vacuum chamber 22 is entirely maintained at 100 Pa can be obtained by dividing the manifold 14 of the internal block 12 into five and introducing helium gas, at a total of 20 sccm into the manifolds 14 at both ends, and at a total of 53 sccm into the three manifolds 14 in the center portion, as a cooling gas through the gas flow path 16. The heat transfer coefficient can be calculated by measuring the temperature of the substrate 21 running on the surface of the blowing roller 90 using a thermocouple, etc., from the running time and variation in the temperature of the substrate 21. The heat transfer coefficient resulting from gas cooling, for example, is 0.003 W/cm$^2$/K, though it also depends on the type of the substrate 21.

In this case, for example, helium gas needs to be introduced at about 680 sccm just by introducing a structure to create a differential pressure into a part of the vacuum chamber 22. The blowing roller 90 allows a reduction in the necessary gas introduction rate to about 1/9. Further, it is possible to enhance the cooling of the substrate 21 in the center portion, thus suppressing the deformation of the substrate 21 effectively.

It is also possible to provide a timing pulley, gear wheels, or the like, at the end portions of the second shell 72 so that the second shell 72 is driven to rotate. The rotation of the second shell 72 causes the rotation of the first shell 51 that is coupled to the second shell 72 by the bearings 55. For example, the second shell 72 is driven to rotate at a rotation rate under which the speed of the outer circumferential surface of the first shell 51 is equal to the speed of the outer circumferential surface of the can 27. Thus, the need to use the substrate 21 as a driving source for rotating the first shell 51 due to the tension of the substrate 21 is eliminated, so that abrasion damage to the substrate 21 by the first shell 51 can be prevented.

The thin film production using the blowing roller 90 is described more specifically. For example, the blowing roller 90 is used instead of the blowing roller 6 of the film-forming apparatus 20B described with reference to FIG. 2.

As the substrate 21, a surface-roughened copper foil (thickness: 18 µm; width: 100 mm), manufactured by Furukawa Circuit Foil Co., Ltd., that serves as a current collector is used, and a silicon multilayer thin film is formed by vacuum evaporation to a thickness of 8 µm on each of both sides of the current collector. The air inside the vacuum chamber 22, provided with two 14 inch-bore oil diffusion pumps that serve as the discharge pumps 35, having a volume of 0.4 m$^3$ is displaced to 0.002 Pa, and thereafter silicon as a film-forming material is melted. Silicon is melted using an electron beam evaporation source with 270-degree deflection (film-forming source 19) manufactured by JEOL Ltd. The molten silicon is irradiated with an electron beam generated by an acceleration voltage of −10 kV and an emission current of 520 to 700 mA, and then the generated vapor is directed toward the substrate 21 running along the can 27.

A metal mask (having a length of each opening of 100 mm) is provided at a position of about 2 mm from the substrate 21 so that the silicon thin film is formed to a width of 85 mm. The conveyance system 50B is configured to allow the substrate 21 to be conveyed reciprocatingly. One cycle of conveyance allows one layer of silicon thin film with a film thickness of about 0.5 µm to be formed on each of both sides of the substrate 21. With reciprocating conveyance, the film formation is repeated 16 times, so that a silicon thin film of about 8 µm is formed.

The formation of the respective layers on both sides of the substrate 21 is performed, for example, with an average emission current of 600 mA, a substrate-conveying speed of 2 m/minute, and an average film-forming rate of 80 nm/second.

The blowing roller 90 (which corresponds to the blowing roller 6a of FIG. 2) is provided on the conveyance channel after a silicon thin film is formed on one surface (first surface) of the substrate 21 before the film formation on the other surface (second surface). The blowing roller 90 is configured so that the first shell 51 has a diameter of 120 mm, a length in the axis direction of 120 mm, and a thickness of 4 mm, the through holes 13 have a diameter of 1 mm and are arranged in five rows with the hole pitch A set to 20 degrees and the hole pitch B set to 15 mm, the second shell 72 has a thickness of 4 mm, the through holes 43 have a diameter of 2 mm and are arranged in five rows at the same position as those in the first shell 51 with the hole pitch C set to 10 degrees and the hole pitch D set to 15 mm, the distance between the first shell 51 and the second shell 72 is set to 120 µm, and the distance between the first shell 51 and the internal block 12 in the clearance 15 is set to 80 µm. Argon gas is introduced into seven ports of the manifolds 14 at a total of 80 sccm as a cooling gas through the gas flow path 16.

Further, a driving force is given to a timing pulley provided at each end portion of the second shell 72 by a driving source, which is not shown, through a timing belt so that the second shell 72 is driven to rotate at five revolutions per minute. This causes the first shell 51 also to rotate via the bearings 55 at an almost equal speed as the can 27. Therefore, no abrasion damage to the substrate 21 is caused by rubbing with the first shell 51.

In the film-forming apparatus 20B, the blowing roller 90 and the blowing roller 80 (FIG. 13) may be used in combination.

In addition, the blowing roller 80 (which corresponds to the blowing roller 6b in FIG. 2) is provided in the course after the completion of the film formation, in the respective conveyance cycles of the substrate 21, before reaching the spool roller 26. This configuration allows a reduction in the temperature of the substrate 21 when being wound to almost room temperature. By reducing the temperature of the substrate 21 when being wound nearly to room temperature, the occurrence of wrinkles due to thermal deformation of the substrate 21 when being wound can be prevented, and a buckling phenomenon due to the contraction of the substrate 21 after being wound can also be prevented. The first shell 51 of the blowing roller 80 may be divided into five first divided shells. For example, the first shell 51 has a diameter of 80 mm, a length in the axis direction of 120 mm, and a thickness of 3 mm, and the through holes 13 have a diameter of 1 mm and are arranged in five rows with the hole pitch A set to 15 degrees and the hole pitch B set to 15 mm. The second shell 58 may also be divided into five second divided shells. The second shell 58 has a thickness of 5 mm, the through holes 43 have a diameter of 4 mm and are arranged in five rows at the same position as those in the first shell 51 with the hole pitch C set to 15 degrees and the hole pitch D set to 15 mm, the distance between the first shell 51 and the second shell 58 is set to 100 μm, and the distance between the second shell 58 and the internal block 65 in the clearance 15 is set to 50 μm. The manifold 14 of the internal block 65 is divided into five. Argon gas is introduced into the manifolds 14 at both ends at a total of 14 sccm, and into the three manifolds 14 in the center portion at a total of 36 sccm, as a cooling gas through the gas flow path 16.

Next, the blowing roller 190 shown in FIG. 15 is obtained by replacing the internal block 12 in the blowing roller 90 shown in FIG. 14 with the divided internal blocks 62 shown in FIG. 11. This blowing roller 190 can be applied to the film-forming apparatus 20C. That is, the blowing roller 190 is used instead of the blowing roller 6 shown in FIG. 3. Hereinafter, an example in which the blowing roller 80 and the blowing roller 190 are used in combination is described.

As the substrate 21, a surface-roughened copper foil (thickness: 18 μm; width: 200 mm), manufactured by Furukawa Circuit Foil Co., Ltd., that serves as a current collector is used, and a silicon oxide multilayer thin film is formed by vacuum evaporation to a thickness of 15 μm on each of both sides of the current collector. The air inside the vacuum chamber 22, provided with two 14 inch-bore oil diffusion pumps that serve as the discharge pumps 35, having a volume of 0.4 m$^3$ is displaced to 0.002 Pa, and thereafter silicon as a film-forming material is melted. Silicon is melted using an electron beam evaporation source with 270-degree deflection (film-forming source 19) manufactured by JEOL Ltd. The molten silicon is irradiated with an electron beam generated by an acceleration voltage of −10 kV and an emission current of 950 mA, and then the generated vapor is directed toward the substrate 21.

The substrate 21 moves at a position of about 0.5 mm from the cooler body 1 cooled by cooling water at 10° C. While the substrate 21 is moving along the cooler body 1, a silicon thin film is formed thereon. The length of the cooler body 1 in the width direction of the substrate 21 is 90 mm. The structure of the cooler body 1 is as mentioned above with reference to FIG. 10.

The metal mask 25 (having a length of each opening of 150 mm) is provided at a position of about 2 mm from the substrate 21 so that the silicon thin film is formed to a width of 180 mm. Further, oxygen gas is directed toward each opening 31 of the metal mask 25 through a reaction gas nozzle provided on the film-forming side of the substrate 21. Thus, a silicon oxide thin film is formed on the substrate 21. One cycle of conveyance allows one layer of silicon thin film with a film thickness of about 1 μm to be formed on each of both sides of the substrate 21. With reciprocating conveyance, the film formation is repeated 15 times, so that a silicon thin film of about 15 μm is formed.

The formation of the respective layers on both sides of the substrate 21 is performed, for example, with an average emission current of 950 mA, a substrate-conveying speed of 3.6 m/minute, and an average film-forming rate of 200 nm/second. At this time, argon gas as a cooling gas is introduced at 9 sccm into the gap between the cooler body 1 and the substrate 21. Further, oxygen gas as a reaction gas for film formation is introduced at 30 sccm through a reaction gas nozzle toward each opening 31.

The blowing roller 80 (which corresponds to the blowing roller 6a of FIG. 3) is provided on the conveyance channel after a silicon thin film is formed on one surface (first surface) of the substrate 21 before the film formation on the other surface (second surface). The blowing roller 80 is configured so that the first shell 51 is not divided and has a diameter of 250 mm, a length in the axis direction of 400 mm, and a thickness of 4 mm, the through holes 13 have a diameter of 1 mm and are arranged in nine rows with the hole pitch A set to 20 degrees and the hole pitch B set to 25 mm, the second shell 58 is divided into nine and has a thickness of 3 mm, the through holes 43 have a diameter of 7 mm and are arranged in eight rows at an intermediate position of the hole pitch B of the first shell 51 with the hole pitch C set to 10 degrees and the hole pitch D set to 25 mm, the distance between the first shell 51 and the second shell 58 is set to 200 μm, and the distance between the second shell 58 and the internal block 65 in the clearance 15 is set to 100 μm. The manifold 14 of the internal block 65 is divided into nine. Oxygen gas is introduced almost uniformly into all the manifolds 14 at a total of 200 sccm as a cooling gas through the first gas flow path 7, and helium gas is introduced into the five manifolds 14 in the center portion at a total of 50 sccm through the second gas flow path 8.

Further, an aluminum block (gas leakage-reducing member) having an average thickness of 5 mm is provided at a position of 200 μm from the outer circumferential surface of the first shell 51. This configuration allows the substrate 21 to be maintained at almost constant temperature at the times of starting the film formation on the respective surfaces of the substrate 21.

Furthermore, the blowing roller 190 (which corresponds to the blowing roller 6b in FIG. 3) is provided in the course after the completion of the film formation, in the respective conveyance cycles of the substrate 21, before reaching the spool roller 26. This configuration allows a reduction in the temperature of the substrate 21 when being wound to almost room temperature. By reducing the temperature of the substrate 21 when being wound nearly to room temperature, the occurrence of wrinkles due to thermal deformation of the substrate 21 when being wound can be prevented, and a buckling phenomenon due to the contraction of the substrate 21 after being wound can also be prevented. The blowing roller 190 is configured so that the first shell 51 is not divided and has a diameter of 200 mm, a length in the axis direction of 400 mm, and a thickness of 3 mm, the through holes 13 have a diameter of 1 mm and are arranged in nine rows with the hole pitch A set to 15 degrees and the hole pitch B set to 25 mm, the second shell 72 is not divided and has a thickness of 4 mm, the through holes 43 have a diameter of 3 mm and are arranged in eight rows at an intermediate position of the hole pitch B of the first shell 51 with the hole pitch C set to 5 degrees and the hole pitch D set to 25 mm, the distance between the first shell 51 and the second shell 72 is set to 100 μm, and the distance between the second shell 72 and the internal block 62 in the clearance 15 is set to 60 μm. The manifold 14 of the internal block 62 is divided into nine. Oxygen gas is introduced almost uniformly into all the manifolds 14 at a total of 100 sccm, and helium gas is introduced into the five manifolds 14 in the center portion at a total of 40 sccm, as a cooling gas through the gas flow path 16 (including the first gas flow path 7 and the second gas flow path 8). A timing pulley, which is not shown, is provided in each of the second shell 58 of the blowing roller 80 and the second shell 72 of the blowing roller 190. The timing pulley is driven by a timing belt and a motor. The angular speed of the second shell 58, for example, is equal to the angular speed of a roller having the same diameter as the first shell 51 when the roller rotates at the same speed as the conveyance speed of the substrate 21. The angular speed of the second shell 190, for example, is equal to the angular speed of a roller having the same diameter as the first shell 51 when the roller rotates at the same speed as the conveyance speed of the substrate 21.

The embodiments of the present invention have been specifically described above. The present invention, however, is not limited to these embodiments. The present invention includes thin film production using a blowing roller provided with an external shell (first shell), an internal block, a manifold, and a clearance. Further, the present invention includes a technique of cooling a substrate by feeding a cooling gas efficiently into the gap between the external shell and the substrate, and periodically repeating receiving heat from the substrate and releasing heat into the internal block with the rotation of the external shell.

As a specific application example, the case of forming a negative electrode for lithium ion secondary batteries has been mainly described in the embodiments. However, the present invention is not limited thereto. For example, a polar plate for electrochemical capacitors can also be formed with a similar configuration. In addition, the present invention can be used in various applications that require stable high-rate film formation, represented by transparent electrode films, capacitors, decorative films, solar cells, magnetic tapes, gas barrier films, various sensors, various optical films, hard protective films, etc. Further, the present invention can be applied to a thin film-manufacturing apparatus for forming various devices.

INDUSTRIAL APPLICABILITY

The present invention enables efficient use of cooling gas, and thus can prevent the reduction in the degree of vacuum in cooling. Further, another gas cooling method can be appropriately used in combination with the present invention, which makes it feasible to provide a thin film-manufacturing apparatus that enables high-rate film formation at low cost while suppressing an increase in the size of equipment such as a discharge pump.

The invention claimed is:
1. A thin film-manufacturing apparatus comprising:
a vacuum chamber;
a conveyance system disposed in the vacuum chamber so that an elongated substrate is conveyed from an unwinding position to a winding position;
an opening provided facing a conveyance channel in the conveyance system; and
a film-forming source for feeding a material to the substrate through the opening,
wherein the conveyance system includes a blowing roller having a function of conveying the substrate and a function of supplying a gas for cooling the substrate toward the substrate, and
the blowing roller includes:
(i) a cylindrical first shell having a cylindrical outer circumferential surface for supporting the substrate and a plurality of first through holes provided along a circumferential direction of the outer circumferential surface as a channel for supplying the gas, the first shell being rotatable in synchronization with the substrate,
(ii) an internal block disposed inside the first shell, the rotation of the internal block in synchronization with the substrate being inhibited,
(iii) a manifold having a relatively large dimension in a radial direction of the first shell, the manifold being formed, as a space defined by the internal block inside the first shell so as to maintain the gas introduced from outside of the vacuum chamber, to introduce the gas toward the plurality of first through holes within a range of a holding angle defined as an angle formed by a contact portion of the first shell and the substrate with a rotation axis of the first shell at the center,
(iv) a clearance having a relatively small dimension in the radial direction, the clearance being formed, as a space formed inside the first shell, to introduce the gas toward the plurality of first through holes outside the range of the holding angle, and
(v) a support body extending through the first shell from a first end of the first shell to a second end of the first shell such that at least a portion of the internal block is disposed between an outer surface of the support body and an inner surface of the first shell in a direction perpendicular to the rotation axis.

2. The thin film-manufacturing apparatus according to claim 1, wherein
the manifold in the circumferential direction is defined in a range so that the manifold faces the plurality of first through holes only within the range of the holding angle.

3. The thin film-manufacturing apparatus according to claim 1, wherein
the internal block has an arcuate outer circumferential surface outside the range of the holding angle, and
the clearance is formed between the outer circumferential surface of the internal block and the inner circumferential surface of the first shell.

4. The thin film-manufacturing apparatus according to claim 1, wherein
the conveyance system includes a first roller disposed on an upstream side of the blowing roller along a conveyance direction of the substrate and a second roller disposed on a downstream side of the blowing roller along the conveyance direction of the substrate, and the holding angle is defined by a relative positional relationship of the first roller, the blowing roller, and the second roller.

5. The thin film-manufacturing apparatus according to claim 1, wherein
the holding angle is in a range of 30 to 180 degrees.

6. The thin film-manufacturing apparatus according to claim 1, wherein
the holding angle is larger than an angle formed by two lines obtained by connecting the rotation axis of the first shell with each center point of two of the first through holes that are adjacent to each other in the circumferential direction.

7. The thin film-manufacturing apparatus according to claim 1, wherein
the plurality of first through holes are formed at equal intervals along the circumferential direction.

8. The thin film-manufacturing apparatus according to claim 1, wherein
the plurality of first through holes constitute (i) a first group provided along the circumferential direction at a specific position in a width direction parallel to the rotation axis, and (ii) a second group provided along the circumferential direction at a position adjacent to the specific position in the width direction, and
the plurality of first through holes belonging to the first group and the plurality of first through holes belonging to the second group form a staggered arrangement.

9. The thin film-manufacturing apparatus according to claim 1, further comprising:
a bearing rotatably connecting the first shell to the support body,
wherein the support body has a gas flow path for introducing the gas from the outside of the vacuum chamber into the manifold, the support body securing the internal block.

10. The thin film-manufacturing apparatus according to claim 1, further comprising:
a gas leakage-reducing member having an arcuate shape along the outer circumferential surface of the first shell, the gas leakage-reducing member being provided at a position facing the outer circumferential surface of the first shell outside the range of the holding angle.

11. The thin film-manufacturing apparatus according to claim 1, wherein
the opening is provided at each of two points on the conveyance channel so that, after a thin film is formed on a first surface of the substrate in a first film-forming region of the conveyance channel, a thin film is formed on a second surface of the substrate in a second film-forming region located on a downstream side of the first film-forming region, and
the conveyance system is constructed so that the substrate is cooled by running on the blowing roller after passing through the first film-fainting region before reaching the second film-forming region.

12. The thin film-manufacturing apparatus according to claim 1, wherein
a plurality of the manifolds are formed along a width direction parallel to the rotation axis of the first shell.

13. The thin film-manufacturing apparatus according to claim 12, wherein
the plurality of first through holes are provided in a plurality of rows corresponding to the plurality of manifolds.

14. The thin film-manufacturing apparatus according to claim 12, wherein the support body secures the internal block,
the support body has a gas flow path for introducing the gas from the outside of the vacuum chamber into the plurality of manifolds, and
the gas flow path communicates with each of the plurality of manifolds.

15. The thin film-manufacturing apparatus according to claim 14, wherein
the gas flow path has (i) a first gas flow path communicating with all the plurality of manifolds, and (ii) a second gas flow path communicating with at least one selected from the plurality of manifolds or one of the manifolds formed on an inner side of two of the manifolds located at both ends in the width direction among the plurality of manifolds.

16. The thin film-manufacturing apparatus according to claim 12, wherein
the internal block is composed of a plurality of divided blocks that are aligned in the width direction so as to define each of the plurality of manifolds, and
the first shell has a plurality of first divided shells that correspond to the plurality of divided blocks.

17. The thin film-manufacturing apparatus according to claim 16, further comprising:
a plurality of bearings connecting the plurality of first divided shells respectively to the plurality of divided blocks.

18. The thin film-manufacturing apparatus according to claim 16, further comprising:
a plurality of bearings rotatably connecting the plurality of first divided shells to the support body,
wherein the support body secures the internal block.

19. The thin film-manufacturing apparatus according to claim 12, further comprising:
a cylindrical second shell disposed between the first shell and the internal block, the second shell having a plurality of second through holes for introducing the gas from the plurality of manifolds into the plurality of first through holes of the first shell, wherein
the internal block is composed of a plurality of divided blocks that are aligned in the width direction so as to define each of the plurality of manifolds, and
the second shell has a plurality of second divided shells that correspond to the plurality of divided blocks.

20. The thin film-manufacturing apparatus according to claim 19, further comprising:
a first bearing rotatably connecting the second shell to the support body; and
a second bearing rotatably connecting the first shell to the second shell,
wherein the support body secures the internal block.

21. The thin film-manufacturing apparatus according to claim 12, Wherein
the support body secures the internal block, and
the support body has a gas flow path for introducing the gas from the outside of the vacuum chamber into the manifolds, and a refrigerant flow path for allowing a refrigerant for cooling the support body to flow.

22. The thin film-manufacturing apparatus according to claim 1, further comprising:
a cylindrical second shell disposed between the first shell and the internal block, the second shell having a plurality of second through holes for introducing the gas from the manifold into the plurality of first through holes of the first shell.

23. The thin film-manufacturing apparatus according to claim 22, further comprising:

a first bearing rotatably connecting the second shell to the support body; and a second bearing rotatably connecting the first shell to the second shell, wherein the support body secures the internal block.

24. The thin film-manufacturing apparatus according to claim 22, wherein the support body has a gas flow path for introducing the gas from the outside of the vacuum chamber into the manifold.

25. The thin film-manufacturing apparatus according to claim 22, wherein the first shell and the second shell are rotatable independently of each other.

26. The thin film-manufacturing apparatus according to claim 22, wherein the second shell has a cylindrical outer circumferential surface, the plurality of second through holes constitute (i) a first group provided along the circumferential direction at a specific position in a width direction parallel to the rotation axis, and (ii) a second group provided along the circumferential direction at a position adjacent to the specific position in the width direction, and the plurality of second through holes belonging to the first group and the plurality of second through holes belonging to the second group form a staggered arrangement.

27. A thin film-manufacturing method comprising the steps of:

constructing a conveyance system for an elongated substrate in a vacuum chamber;

conveying the elongated substrate from an unwinding position to a winding position in the conveyance system; and evaporating a material from a film-forming source toward an opening provided facing a conveyance channel in the conveyance system so that the material is fed onto the substrate, wherein the conveyance system includes a blowing roller having a function of conveying the substrate and a function of supplying a gas for cooling the substrate toward the substrate, a first roller disposed on an upstream side of the blowing roller along a conveyance direction of the substrate, and a second roller disposed on a downstream side of the blowing roller along the conveyance direction of the substrate, and the blowing roller includes:

(i) a cylindrical first shell having a cylindrical outer circumferential surface for supporting the substrate and a plurality of first through holes provided along a circumferential direction of the outer circumferential surface as a channel for supplying the gas, the first shell being rotatable in synchronization with the substrate, (ii) an internal block disposed inside the first shell, the rotation of the internal block in synchronization with the substrate being inhibited, (iii) a manifold having a relatively large dimension in a radial direction of the first shell, the manifold being formed, as a space defined by the internal block inside the first shell so as to maintain the gas introduced from outside of the vacuum chamber, to introduce the gas toward the plurality of first through holes within a range of a specific angle with a rotation axis of the first shell at center, (iv) a clearance having a relatively small dimension in the radial direction, the clearance being formed, as a space formed inside the first shell, to introduce the gas toward the plurality of first through holes outside the range of the specific angle, and (v) a support body extending through the first shell from a first end of the first shell to a second end of the first shell such that at least a portion of the internal block is disposed between an outer surface of the support body and an inner surface of the first shell in a direction perpendicular to the rotation axis, wherein the first roller, the blowing roller, and the second roller are set to have a relative positional relationship, in the process of constructing the conveyance system, such that the specific angle should fall within a range of a holding angle defined as an angle formed by a contact portion of the first shell and the substrate.

28. A substrate-conveying roller having a function of conveying a substrate under vacuum and a function of supplying a gas for cooling the substrate toward the substrate under vacuum, the substrate-conveying roller comprising:

(i) a cylindrical first shell having a cylindrical outer circumferential surface for supporting the substrate and a plurality of first through holes provided along a circumferential direction of the outer circumferential surface as a channel for supplying the gas, the first shell being rotatable in synchronization with the substrate, (ii) an internal block disposed inside the first shell, the rotation of the internal block in synchronization with the substrate being inhibited, (iii) a manifold having a relatively large dimension in a radial direction of the first shell, the manifold being formed, as a space defined by the internal block inside the first shell so as to maintain the gas introduced from outside, to introduce the gas toward the plurality of first through holes within a range of a specific angle with a rotation axis of the first shell at center, and (iv) a clearance having a relatively small dimension in the radial direction, the clearance being formed, as a space formed inside the first shell, to introduce the gas toward the plurality of first through holes outside the range of the specific angle, v) a support body extending through the first shell from a first end of the first shell to a second end of the first shell such that at least a portion of the internal block is disposed between an outer surface of the support body and an inner surface of the first shell in a direction perpendicular to the rotation axis.

* * * * *